(12) United States Patent
Kim et al.

(10) Patent No.: US 10,608,169 B2
(45) Date of Patent: Mar. 31, 2020

(54) MAGNETIC TUNNEL JUNCTION DEVICE WITH SPIN-FILTER STRUCTURE

(71) Applicant: KOREA UNIVERSITY RESEARCH AND BUSINESS FOUNDATION, Seoul (KR)

(72) Inventors: Young Keun Kim, Seoul (KR); Kyung-Jin Lee, Seoul (KR); Gyungchoon Go, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 15/639,662

(22) Filed: Jun. 30, 2017

(65) Prior Publication Data
US 2018/0190899 A1 Jul. 5, 2018

(30) Foreign Application Priority Data
Jan. 3, 2017 (KR) .................. 10 2017 0000532

(51) Int. Cl.
*H01L 27/22* (2006.01)
*H01L 43/08* (2006.01)
(Continued)

(52) U.S. Cl.
CPC ............ *H01L 43/08* (2013.01); *G11C 11/161* (2013.01); *G11C 11/1653* (2013.01);
(Continued)

(58) Field of Classification Search
CPC ....... H01L 43/08; H01L 43/10; H01L 43/065; H01L 43/04; H01L 27/228; G11C 11/161;
(Continued)

(56) References Cited

U.S. PATENT DOCUMENTS

| 8,416,618 B2 | 4/2013 | Gaudin et al. |
| 9,076,537 B2 | 7/2015 | Khvalkovskiy et al. |

(Continued)

FOREIGN PATENT DOCUMENTS

| EP | 1925946 A2 | 5/2008 |
| JP | 2002/359413 A | 12/2002 |

(Continued)

OTHER PUBLICATIONS

Li et al., Spin wave, skyrmion, and spin-orbit torques devices, p. 64 (Year: 2013).*

(Continued)

*Primary Examiner* — Ismail A Muse
(74) *Attorney, Agent, or Firm* — Jenkins, Wilson, Taylor & Hunt, P.A.

(57) ABSTRACT

A magnetic device includes a conductive layer into which current can be injected in a first direction, the conductive layer causing spin Hall effect or Rashba effect. A ferromagnetic layer is disposed in contact with the conductive layer such that the ferromagnetic layer and the conductive layer are stacked on each other, a magnetization direction of the ferromagnetic layer being switched. A spin filter structure has a fixed magnetization direction, the spin filter structure being disposed on at least one of the opposite side surfaces of the first direction of the conductive layer to inject spin-polarized current into the conductive layer.

14 Claims, 22 Drawing Sheets

(51) Int. Cl.
| | |
|---|---|
| *G11C 11/18* | (2006.01) |
| *G11C 11/16* | (2006.01) |
| *H01L 43/02* | (2006.01) |
| *H01L 43/04* | (2006.01) |
| *H01L 43/06* | (2006.01) |
| *H01L 43/10* | (2006.01) |

(52) U.S. Cl.
CPC ...... *G11C 11/1657* (2013.01); *G11C 11/1659* (2013.01); *G11C 11/1675* (2013.01); *G11C 11/18* (2013.01); *H01L 43/02* (2013.01); *H01L 43/04* (2013.01); *H01L 43/065* (2013.01); *H01L 43/10* (2013.01); *H01L 27/228* (2013.01)

(58) Field of Classification Search
CPC ............ G11C 11/1657; G11C 11/1653; G11C 11/1675; G11C 11/18; G11C 11/1659
See application file for complete search history.

(56) References Cited

U.S. PATENT DOCUMENTS

| | | | |
|---|---|---|---|
| 9,218,864 B1 | 12/2015 | Yi et al. | |
| 9,460,397 B2 | 10/2016 | Apalkov et al. | |
| 9,691,458 B2 | 6/2017 | Ralph et al. | |
| 2007/0164336 A1* | 7/2007 | Saito | G11C 11/16 257/295 |
| 2012/0087181 A1* | 4/2012 | Lung | H01L 27/10 365/163 |
| 2014/0084399 A1* | 3/2014 | Doczy | H01L 43/08 257/421 |
| 2015/0145575 A1 | 5/2015 | Wu et al. | |
| 2015/0236071 A1 | 8/2015 | Lee et al. | |
| 2015/0248907 A1* | 9/2015 | Freitag | G11B 5/3116 360/99.08 |
| 2016/0276006 A1* | 9/2016 | Ralph | G11C 11/18 |
| 2016/0293836 A1* | 10/2016 | Lim | H01L 43/12 |
| 2017/0047508 A1* | 2/2017 | Shoji | B82Y 25/00 |
| 2017/0163275 A1* | 6/2017 | Manipatruni | H01L 43/08 |
| 2018/0123026 A1* | 5/2018 | Sasaki | G11C 11/161 |

FOREIGN PATENT DOCUMENTS

| | | |
|---|---|---|
| JP | 3839682 B2 | 1/2006 |
| JP | 2010/245415 A | 10/2010 |
| JP | 2014/045196 A | 3/2014 |
| JP | 5448242 B2 | 3/2014 |
| JP | 6328391 B2 | 5/2018 |
| KR | 1020160134598 A | 11/2016 |
| WO | WO 2014/046361 A1 | 3/2014 |
| WO | WO 2015/102739 A3 | 7/2015 |
| WO | WO 2015/195122 A1 | 12/2015 |
| WO | WO 2016/021468 A1 | 2/2016 |

OTHER PUBLICATIONS

Debanjan, Spin orbit torque driven magnetic switching and memory, p. 25 (Year: 2017).*
Byong-Guk Park, MRAM (SOT-based memory) (Year: 2019).*
Fabian et al., Evaluation of Hybrid Memory Technologies Using SOT-MRAM for On-Chip Cache Hierarchy., p. 2 (Year: 2015).*
Moshen, A Low-Power Hybrid Magnetic Cache Architecture Exploiting Narrow-Width Values, p. 3 (Year: 2016).*
Sparsh et al, A Comprehensive Tool with 3D and Multi-Level Cell Memory Modeling Capability, 2017, p. 8 (Year: 2017).*
Sugahara, et al., "A spin metal-oxide-semiconductor field-effect transitor using half-metalic-ferromagnetic contacts for the source and drain", Applied Physics Letters, vol. 84, No. 13, pp. 2307-2309 dated Mar. 29, 2004.
Japanese Office Action for Application No. JP 2017-119625 dated Dec. 5, 2017.
Korean Office Action for Application No. KR 10-2017-0000532 dated Aug. 29, 2017.
European Search Report for European Application No. EP 17001094.6 dated Feb. 13, 2018.
Japanese Office Action for Application No. JP 2017-536563 dated Jul. 24, 2018.
Amin, V.P., et al., "Spin transport at interfaces with spin-orbit coupling: Formalism," Physical Review B 94, 104419, pp. 104419-1-104419-16 dated Sep. 16, 2016.
Chen, H., et al., "Anomalous Hall Effect Arising from Noncollinear Antiferromagnetism," Physical Review Letters 112, 017205, pp. 017205-1-017205-5, dated Jan. 10, 2014.
Garello, K., et al., "Symmetry and magnitude of spin-orbit torques in ferromagnetic heterostructures," Nature Nanotechnology, Advance Online Publication, <www.nature.com/naturenanotechnology>, pp. 1-7, dated Jul. 28, 2013.
Mendes, J.B.S., et al., "Large inverse spin Hall effect in the antiferromagnetic metal Ir20Mn80," Physical Review B 89, 140406(R), pp. 140406-1-140406-5, dated Apr. 17, 2014.
Miron, I.M., et al., "Perpendicular switching of a single ferromagnetic layer induced by in-plane current injection," Nature, vol. 476, pp. 189-194, dated Aug. 11, 2011.
Taniguchi, T., et al., "Spin-Transfer Torques Generated by the Anomalous Hall Effect and Anisotropic Magnetoresistance," Physical Review Applied 3, 044001, pp. 044001-1-044001-18, dated Apr. 6, 2015.
Grant of Patent for Korean Application No. 10-2017-0000532 dated Jan. 23, 2018.
Japanese Office Action for Application No. JP 2017-119625 dated Jun. 26, 2018.
Decision to Grant a Patent for Japanese Application No. 2017-119625 dated Oct. 30, 2018.

* cited by examiner (a)

(b)

(c)

(a)

(b)

(c)

MAGNETIC TUNNEL JUNCTION DEVICE WITH SPIN-FILTER STRUCTURE

CROSS-REFERENCE TO RELATED APPLICATIONS

This U.S. non-provisional application claims priority under 35 U.S.C. § 119 to Korea Patent Application No. 10-2017-0000532 filed on Jan. 3, 2017, the entirety of which is hereby incorporated by reference.

TECHNICAL FIELD

The present disclosure relates to magnetic tunnel junction devices and, more particularly, to a magnetic tunnel junction device which generates a spin orbit torque.

BACKGROUND

A ferromagnetic body means a material that is spontaneously magnetized even though a strong magnetic field is not applied thereto from the outside. In a magnetic tunnel junction structure (first magnetic body/insulator/second magnetic body) in which an insulator is interposed between two ferromagnetic bodies, an electric resistance varies depending on relative magnetization directions of two magnetic layers, i.e., a tunnel magnetoresistance (TMR) effect occurs. The TMR effect occurs because up-spin and down-spin electrons flow at different degrees at the magnetic tunnel junction structure while tunneling an insulator.

According to the law of action and reaction that is Newton's third law of motion, if the magnetization direction may control a flow of current, it is also possible to control a magnetization direction of the magnetic layer by applying current due to the reaction. If current is applied to the magnetic tunnel junction structure in a direction perpendicular to a film surface, the current spin-polarized by a first magnetic body (magnetization pinned magnetic layer, hereinafter referred to as "pinned magnetic layer") transfers its spinning angular momentum while passing through a second magnetic body (magnetization free magnetic layer, hereinafter referred to as "free magnetic layer"). A torque felt by magnetization due to the transfer of spinning angular momentum is called a spin-transfer torque (STT). Use of the spin-transfer torque make it possible to fabricate a device for reversing the free magnetic layer or continuously rotating the free magnetic layer or a device for moving a magnetic domain wall of the free magnetic layer.

Moreover, the magnetic tunnel junction may lead to magnetization reversion of a free magnetic layer or movement of a magnetic domain structure by using a spin-orbit torque (SOT) generated by spin Hall effect or Rashba effect when in-plane current flows in a conducting wire adjacent to the free magnetic layer.

A magnetization reversing device using a spin-orbit torque is disclosed in U.S. Pat. No. 8,416,618 B2.

As utilization of mobile devices and Internet of things (IoT) electronic devices continues to increase, low-power, small-area, ultrahigh-speed, and non-volatile memories have come into spotlight.

SUMMARY

A feature of the present disclosure is to provide a magnetic device in which spin-polarized current is provided to a conductive layer, which is in contact with a free magnetic layer to provide in-plane current, through a spin filter to additionally provide spin accumulation to an interface between the conductive layer and the free magnetic layer and field-free switching is possible where an external magnetic field does not need to be applied when a magnetization direction of a spin filter structure is set to a plane perpendicular direction.

Another feature of the present disclosure is to provide a magnetic device in which spin-polarized current is provided to a conductive layer, which is in contact with a free magnetic layer to provide in-plane current, through a spin filter structure to increase spin accumulation caused by spin Hall effect at the interface between the conductive layer and the free magnetic layer to easily switch the free magnetic layer.

Another feature of the present disclosure is to provide a magnetic device in which spin-polarized current is provided to a conductive layer, which is in contact with a free magnetic layer to provide in-plane current, through a spin filter structure to provide spin accumulation caused by spin Hall effect and spin accumulation having an in-plane direction to the interface between the conductive layer and the free magnetic layer.

Another feature of the present disclosure is to provide a magnetic device in which spin-polarized current is provided to a conductive layer, which is in contact with a free magnetic layer to provide in-plane current, to provide spin accumulation to the interface between the conductive layer and the free magnetic layer.

Another feature of the present disclosure is to provide a device structure which enhances spin splitting efficiency to increase the effect of spin-orbit torque (SOT).

Another feature of the present disclosure is to improve a structure of a magnetic memory.

The features of the present disclosure are not limited to the foregoing, but other features not described herein will be clearly understood by those skilled in the art from the following descriptions.

A magnetic device according to an example embodiment of the present disclosure includes: a conductive layer into which current is injected in a first direction, the conductive layer causing spin Hall effect or Rashba effect; a ferromagnetic layer disposed in contact with the conductive layer such that the ferromagnetic layer and the conductive layer are stacked on each other, a magnetization direction of the ferromagnetic layer being switched; and a spin filter structure having a fixed magnetization direction, the spin filter structure being disposed on at least one of the opposite side surfaces of the first direction of the conductive layer to inject spin-polarized current into the conductive layer.

In an example embodiment, spin polarization of the spin filter structure may be greater than 0 and equal to or smaller than 1.

In an example embodiment, the spin filter structure may be a half-metallic ferromagnet.

In an example embodiment, the half-metallic ferromagnet may include at least one of a Heusler alloy, magnetite ($Fe_3O_4$), and lanthanum strontium manganite (LSMO).

In an example embodiment, the spin filter structure may include a ferromagnet. A magnetization direction of the spin filter structure may be parallel or antiparallel to a magnetization direction of the ferromagnetic layer.

In an example embodiment, a magnetization direction of the spin filter structure may be antiparallel at opposite sides of the conductive layer when the spin filter structure is disposed on opposite side surfaces of the conductive layer.

In an example embodiment, the conductive layer and the ferromagnetic layer may be aligned with each other.

In an example embodiment, the free magnetic layer may have perpendicular magnetic anisotropy (PMA).

In an example embodiment, a spin-flip diffusion length of the conductive layer may be between 3 and 4 nanometers.

A magnetic tunnel junction device according to an example embodiment of the present disclosure includes: a magnetic tunnel junction including a pinned magnetic layer, a free magnetic layer, and a tunnel barrier layer interposed between the pinned magnetic layer and the free magnetic layer; a conductive pattern to which in-plane current flows, the conductive pattern being disposed adjacent to the free magnetic layer of the magnetic tunnel junction to cause spin Hall effect or Rashba effect to apply a spin torque to the free magnetic layer of the magnetic tunnel junction; and a spin filter structure disposed on at least one of the opposite side surfaces of the conductive pattern in a direction in which in-plane current is applied. The spin filter structure may filter injected current to control the amount and direction of a spin and to supply the filtered current to the conductive pattern.

In an example embodiment, the pinned magnetic layer may have a synthetic antiferromagnetic structure including a first pinned magnetic layer, a non-magnetic layer for a pinned magnetic layer, and a second pinned magnetic layer which are sequentially stacked. Each of the first pinned magnetic layer and the second pinned magnetic layer may independently include at least one of Fe, Co, Ni, Gd, B, Si, Zr, and a combination thereof. The non-magnetic layer for a pinned magnetic layer may include at least one of Ru, Ta, Cu, Pt, Pd, W, Cr, and a combination thereof.

In an example embodiment, the pinned magnetic layer may have an exchange-biased antiferromagnetic structure including an antiferromagnetic layer, a first pinned magnetic layer, a non-magnetic layer for a pinned magnetic layer, and a second pinned magnetic layer which are sequentially stacked. The antiferromagnetic layer may be formed of one selected from the group consisting of Pt, Ir, Fe, Mn, and a combination thereof. Each of the first pinned magnetic layer and the second pinned magnetic layer may independently include at least one of Fe, Co, Ni, Gd, B, Si, Zr, and a combination thereof. The non-magnetic layer for a pinned magnetic layer may include at least one of Ru, Ta, Cu, Pt, Pd, W, Cr, and a combination thereof.

In an example embodiment, the tunnel barrier layer may include at least one of $AlO_x$, $MgO$, $TaO_x$, $ZrO_x$, and a combination thereof.

In an example embodiment, the conductive pattern may provide a spin-orbit torque (SOT) resulting from a spin-orbit coupling force between the free magnetic layer and the conductive pattern. The conductive pattern may be formed of one selected from the group consisting of Cu, Ta, Pt, W, Bi, Ir, Mn, Ti, Cr, Pd, Re, Os, Hf, Mo, Ru, and a combination thereof.

In an example embodiment, the free magnetic layer may include at least one magnetic domain structure.

In an example embodiment, the conductive pattern applying the in-plane current may include an antiferromagnetic layer and a ferromagnetic layer which are sequentially stacked, the antiferromagnetic layer may be disposed adjacent to the free magnetic layer, the ferromagnetic layer may have an in-plane magnetization direction, the conductive pattern may provide an in-plane exchange bias magnetic field to the free magnetic layer, and the free magnetic layer may be switched without an external magnetic field.

In an example embodiment, the magnetic tunnel junction device may further include a dipole field non-magnetic layer and a dipole field magnetic layer having an in-plane magnetization direction which are sequentially stacked adjacent to the pinned magnetic layer. The dipole field non-magnetic layer may be disposed adjacent to the pinned magnetic layer. The free magnetic layer may be switched without an external magnetic field.

In an example embodiment, the magnetic tunnel junction device may further include an auxiliary insulating layer disposed between the conductive pattern and the free magnetic layer.

In an example embodiment, the conductive patterns may include a conducting wire non-magnetic layer and a conducting wire ferromagnetic layer which are sequentially stacked. The conducting wire ferromagnetic layer may include an in-plane magnetization direction component.

In an example embodiment, the conductive pattern may include a conducting wire ferromagnetic layer and a conducting wire non-magnetic layer which are sequentially stacked. A non-magnetic layer may be provided between the conducting wire ferromagnetic layer and the free magnetic layer.

A magnetic memory device according to an example embodiment of the present disclosure includes: a plurality of magnetic tunnel junctions arranged in a matrix form; a first conductive pattern disposed adjacent to a free magnetic layer of the magnetic tunnel junction; and a spin filter structure disposed on at least one of the opposite side surfaces of the first conductive pattern. The conductive pattern may provide a spin-orbit torque resulting from a spin-orbit coupling force between the free magnetic layer and the conductive pattern. The spin filter structure may supply spin-polarized current to the conductive pattern.

In an example embodiment, the first conductive pattern may be formed of one selected from the group consisting of Cu, Ta, Pt, W, Bi, Ir, Mn, Ti, Cr, Pd, Re, Os, Hf, Mo, Ru, and a combination thereof.

In an example embodiment, the first conductive pattern may apply in-plane current and may include an antiferromagnetic layer. The first conductive pattern may provide an in-plane exchange bias magnetic field to the free magnetic layer.

In an example embodiment, the free magnetic layer may include at least one magnetic domain structure.

In an example embodiment, the first conductive pattern may apply in-plane current and includes an antiferromagnetic layer and a ferromagnetic layer which are sequentially stacked, the antiferromagnetic layer may be disposed adjacent to the free magnetic layer, the antiferromagnetic layer may have an in-plane magnetization direction, the first conductive pattern may provide an in-plane exchange bias magnetic field to the free magnetic layer, and the free magnetic layer may be switched without an external magnetic field.

In an example embodiment, the magnetic memory device may further include a dipole field non-magnetic layer and a dipole field magnetic layer having an in-plane magnetization direction which are sequentially stacked adjacent to the pinned magnetic layer. The dipole field non-magnetic layer may be disposed adjacent to the pinned magnetic layer.

In an example embodiment, the magnetic memory device may further include an auxiliary insulating layer disposed between the first conductive pattern and the free magnetic layer.

In an example embodiment, the first conductive pattern may include a first conductive pattern non-magnetic layer and a first conductive pattern magnetic layer which are sequentially stacked. The first conductive pattern magnetic layer may include an in-plane magnetization direction component.

In an example embodiment, the first conductive pattern may include a first conductive pattern magnetic layer and a first conductive pattern non-magnetic layer which are sequentially stacked. A non-magnetic layer may be provided between the first conductive pattern magnetic layer and the free magnetic layer.

In an example embodiment, the first conductive patterns may extend parallel to each other on a substrate plane in a first direction. A free magnetic layer of each of the magnetic tunnel junctions arranged in the first direction may be periodically disposed adjacent to the first conductive pattern. The magnetic memory device may further include a second conductive pattern which is electrically connected to a pinned magnetic layer 140 of each of the magnetic tunnel junctions 101 arranged in a second direction perpendicular to the first direction and extends on the substrate plane in the second direction.

In an example embodiment, the first conductive patterns may be periodically disposed on a substrate plane in a first direction. A free magnetic layer of each of the magnetic tunnel junctions arranged in the first direction may be periodically disposed adjacent to the first conductive pattern. The magnetic memory device may further include: a second conductive pattern which is electrically connected to a pinned magnetic layer of each of the magnetic tunnel junctions arranged in the first direction and extends on the substrate plane in the first direction; a third conductive pattern which is connected to one end of each of the first conductive patterns arranged in the first direction and extends in the first direction; and a fourth conductive pattern which is connected to the other end of each of the first conductive patterns arranged in the second direction and extends in the second direction.

In an example embodiment, the first conductive pattern may extend on a substrate plane in a first direction. A free magnetic layer of each of the magnetic tunnel junctions arranged in the first direction may be periodically disposed adjacent to the first conductive pattern. The magnetic memory device may further include: selection transistors which are electrically connected to pinned magnetic layers of the magnetic tunnel junctions, respectively; a second conductive pattern which is electrically connected to source/drain of each of the selection transistors arranged in the first direction and extends on the substrate plane in the first direction; and a third conductive pattern which is connected to a gate of each of the selection transistors arranged in a second direction perpendicular to the first direction.

In an example embodiment, the first conductive pattern may extend on a substrate plane in a first direction. A free magnetic layer of each of the magnetic tunnel junctions arranged in the first direction may be periodically disposed adjacent to the first conductive pattern. The magnetic memory device may further include: selection transistors which are electrically connected to pinned magnetic layers of the magnetic tunnel junctions, respectively; a second conductive pattern which is electrically connected to source/drain of each of the selection transistors arranged in a second direction perpendicular to the first direction and extends on the substrate plane in the second direction; and a third conductive pattern which is connected to a gate of each of the selection transistors arranged in the first direction.

In an example embodiment, the first conductive pattern may extend on a substrate plane in a first direction. A free magnetic layer of each of the magnetic tunnel junctions arranged in the first direction may be periodically disposed adjacent to the first conductive pattern. The magnetic memory device may further include: a second conductive pattern which is electrically connected to each of the pinned magnetic layers of the magnetic tunnel junctions arranged in the first direction; a third conductive pattern which is connected to one end of each of the first conductive patterns arranged in the first direction and extends in the first direction; selection transistors which are connected to the other end of each of the first conductive patterns; a fourth conductive pattern which are connected to source/drain of each of the selection transistors arranged in the first direction and extends in the first direction; and a fifth conductive pattern which is connected to a gate of each of the selection transistors arranged in a second direction perpendicular to the first direction and extends in the second direction.

In an example embodiment, the first conductive pattern may extend on a substrate plane in a first direction. A free magnetic layer of each of the magnetic tunnel junctions arranged in the first direction may be periodically disposed adjacent to the first conductive pattern. The magnetic memory device may further include: selection transistors which are connected to pinned magnetic layers of the magnetic tunnel junctions, respectively; a second conductive pattern which is connected to source/drain of each of the selection transistors arranged in the first direction; a third conductive pattern which is connected to a gate of each of the selection transistors arranged in a second direction perpendicular to the first direction and extends in the second direction; a fourth conductive pattern which is connected to one end of each of the first conductive patterns arranged in the first direction and extends in the first direction; and a fifth conductive pattern which is connected to the other end of each of the first conductive patterns arranged in the first direction and extends in the first direction.

In an example embodiment, the first conductive pattern may extend on a substrate plane in a first direction. A free magnetic layer of each of the magnetic tunnel junctions arranged in the first direction may be periodically disposed adjacent to the first conductive pattern. The magnetic memory device may further include: a second conductive pattern which is electrically connected to each of the pinned magnetic layers of the magnetic tunnel junctions arranged in the first direction and extend in a second direction perpendicular to the first direction; a first selection transistor which is connected to one end of each of the first conductive patterns; a second selection transistors which is connected to the other end of each of the first conductive patterns; a third conductive pattern which is connected to source/drain of the first selection transistor disposed in the first direction and extends in the first direction; a fourth conductive pattern which is connected to source/drain of the second selection transistor disposed in the first direction and extends in the first direction; and a fifth conductive pattern which connects a gate of the first selection transistor arranged in a second direction perpendicular to the first direction and a gate of the second selection transistor to each other to extend in the second direction.

In an example embodiment, the first conductive pattern may extend on a substrate plane in a first direction. A free magnetic layer of each of the magnetic tunnel junctions arranged in the first direction may be periodically disposed adjacent to the first conductive pattern. The magnetic memory device may further include: a first selection transistor which is connected to each of the pinned magnetic layers of the magnetic tunnel junctions; a second transistor which is connected to one end of each of the first conductive patterns; a second conductive pattern which is connected to source/drain of the first selection transistor disposed in the first direction; a third conductive pattern which connects the other ends of the first conductive patterns arranged in the first direction to each other and extends in the first direction; a fourth conductive pattern which connects sources/drains of the second selection transistors arranged in the first direction to each other and extends in the first direction; a fifth conductive pattern which connects gates of the first selection transistors arranged in a second direction perpendicular to the first direction to each other and extends in the second direction; and a sixth conductive pattern which connect gates of the second selection transistors arranged in the second direction to each other and extends in the second direction.

BRIEF DESCRIPTION OF THE DRAWINGS

The present disclosure will become more apparent in view of the attached, example drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present disclosure.

DETAILED DESCRIPTION

In recent years, there are becoming attractive material and device technologies which may significantly improve write performance of a memory by easily reversing (switching) a magnetization direction of a ferromagnet (FM) with low energy, from a spin-orbit torque (SOT) generated by spin Hall effect caused by strong spin-orbit coupling (SOC) of the non-magnet or Rashba effect of a ferromagnet/double layer interface in a double-layer structure including the ferromagnet (FM) and a non-magnet (NM).

Figure 1:
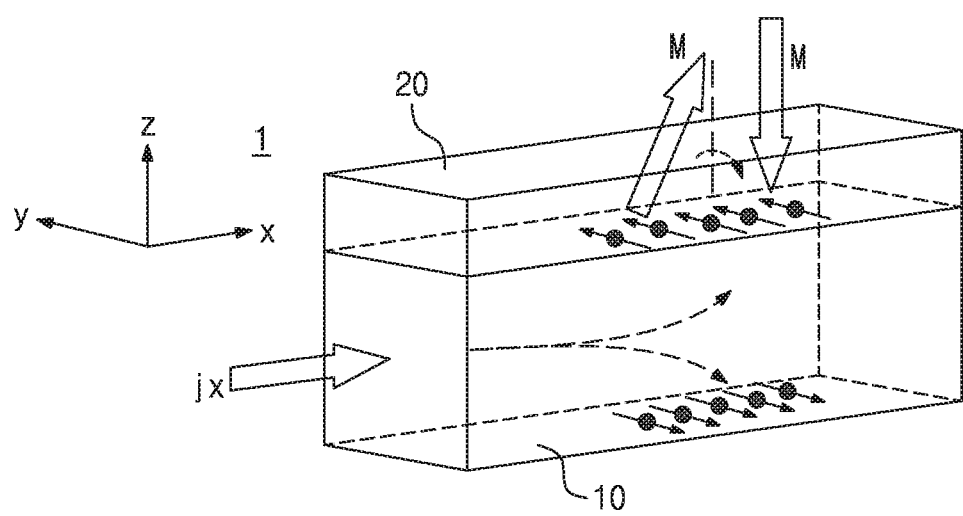
FIG. 1 is a perspective view of a conventional magnetic device using a spin-orbit torque.

FIG. 1 is a perspective view of a conventional magnetic device using a spin-orbit torque.

Referring to FIG. 1, when in-plane current is $j_x$ injected into a non-magnetic layer 10 in an x axis direction, spin current is generated such that a spin polarized in a y axis direction is transported in a z axis direction by spin Hall effect occurring in the non-magnetic layer 10. Thus, spin accumulation may be provided to an interface of the non-magnetic layer 10/a free magnetic layer 20. A polarization direction of a spin accumulated on a top surface of the non-magnetic layer 10 is +y direction, and a polarization direction of a spin accumulated on a bottom surface of the non-magnetic layer 10 is −y direction. If Rashba effect exists at the interface of the non-magnetic layer 10/the free magnetic layer 20, spin accumulation polarized in the +y direction (or −y direction) may be provided on a top surface of the non-magnetic layer 10 when in-plane current $j_x$ is injected into the non-magnetic layer 10 in the x axis direction.

The in-plane current flowing to the non-magnetic layer 10 generates spin accumulation caused by spin Hall effect in the non-magnetic layer 10 or Rashba effect at a ferromagnetic/non-magnetic interface, and the accumulated spin provides a spin torque to a ferromagnet. Since both the spin Hall effect and the Rashba effect arises from strong spin-orbit coupling, a spin torque generated therefrom is called a spin-orbit torque (SOT). Thus, out-of-plane magnetization of a ferromagnetic layer may be switched from a spin-orbit torque generated when in-plane current is applied in a ferromagnetic/non-magnetic double structure. An SOT switching mechanism provides fast switching and device stability. However, the SOT switching mechanism has several disadvantages. It is reported that switching current required for the SOT switching is greater than conventional current for a spin-transfer torque.

In the case that in-plane is injected, spin-orbit coupling effect generates spin accumulation at a ferromagnetic/non-magnetic interface and the spin accumulation causes a spin-orbit torque at the ferromagnetic layer. Thus, a method for providing a device structure suitable to reduce switching current is to increase spin accumulation at a ferromagnetic/non-magnetic interface. To this end, we propose a structure where a ferromagnetic spin filter structure is abutted on a side surface of a non-magnetic layer. Apart from spin Hall effect, current supplied through the spin filter structure generates spin accumulation corresponding to a magnetization direction of the spin filter structure at a ferromagnetic/non-magnetic interface. That is, when in-plane current is applied to a conducting wire, the spin filter structure itself may cause a spin transfer torque corresponding to the magnetization of the spin filter structure at the ferromagnetic layer. Accordingly, a spin torque emerging when in-plane current is applied in a non-magnetic/ferromagnetic double structure on which the spin filter structure is added is approximately given by a vector sum of a spin-orbit torque caused by spin-orbit coupling and a spin-transfer torque generated from spin filter effect. The spin filter structure may additionally provide spin accumulation to apply the spin-orbit torque or the spin-transfer torque. Thus, critical current may be reduced to reduce power consumption.

By suitably adjusting the magnetization direction of the spin filter structure, spin accumulation occurring from the spin filter structure may be additively coupled with the spin accumulation caused by spin Hall effect. For example, in the case that a spin direction by the spin Hall effect is y axis direction, spin accumulation may be summed in the y axis direction if the magnetization direction of the spin filter structure is aligned in the y axis direction. Thus, additive spin accumulation from the spin filter structure may increase a spin torque acting on the ferromagnetic layer.

When the magnetization direction of the spin filter structure is z axis direction, spin-polarized current may provide spin accumulation of the z axis direction and spin accumulation caused by the spin Hall effect may provide spin accumulation in the y axis direction. The vector sum may increase a size of the total spin torque and may cause magnetization reversal of the free magnetic layer (the ferromagnetic layer) without an external magnetic field.

When in-plane current is injected into a non-magnet (NM) in a non-magnet (NM)-ferromagnet (FM) junction structure, a spin-orbit torque may be caused by strong spin-orbit coupling (SOC) between the non-magnet (NM) and the ferromagnet (FM) to easily switch a magnetization direction of the ferromagnet (FM).

In the case of a conventional method, spin splitting occurs due to spin-orbit coupling (SOC) effect when in-plane current is injected into the non-magnet (NM). Among all spins, half the spins migrate to a ferromagnetic layer joined to a non-magnetic layer and the other spins migrate in an opposite direction. The spins migrating to the ferromagnetic layer causes a spin-orbit torque (SOT) to change a magnetization (M) direction of the ferromagnetic layer. However, since current is injected into a non-magnetic layer in a conventional structure, spin splitting efficiency does not exceed 50 percent.

A magnetic device according to an example embodiment of the present disclosure has a stacked structure in which a ferromagnetic layer and a non-magnetic layer are stacked. A spin filter (SF) structure is abutted on at least one side of a direction in which in-plane current flows from the non-magnetic layer. The spin filter structure may convert current injected into the spin filter structure into spin current spin-polarized in one direction. The direction of the spin polarization may depend on a magnetization of the spin filter structure. Thus, the spin filter structure allows the non-magnetic layer to receive spin current which is more polarized in a specific direction. The spin current may be spin current polarized in the magnetization direction of the ferromagnetic layer. That is, the spin filter structure may control the amount and direction of the spin filter structure to enhance efficiency of a spin-orbit torque between the ferromagnetic layer and the non-magnetic layer. The spin-polarized current generates an additional spin chemical potential difference at a ferromagnetic/non-magnetic interface from the spin filter structure and may cause a spin transfer torque (STT) in the ferromagnetic layer.

A suitable magnetization direction of the spin filter structure may remove an external magnetic field required for magnetization switching.

Example embodiments will now be described more fully with reference to the accompanying drawings, in which some example embodiments are shown. Example embodiments may, however, be embodied in many different forms and should not be construed as being limited to the embodiments set forth herein; rather, these example embodiments are provided so that this disclosure will be thorough and complete, and will fully convey the scope of example embodiments of the present disclosure to those of ordinary skill in the art. In the drawings, the thicknesses of layers and regions are exaggerated for clarity. Like reference characters and/or numerals in the drawings denote like elements, and thus their description may be omitted.

In the present disclosure, we have theoretically analyzed the effect of a spin filter structure with respect to a non-magnetic/ferromagnetic double structure. Hereinafter, the operation principle of the present disclosure will now be described.

Figure 2:
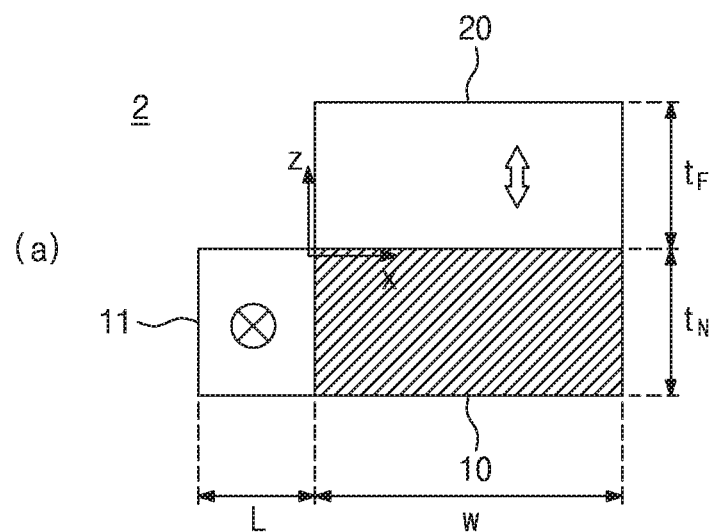
FIG. 2 is a conceptual diagram of a magnetic device including a spin filter structure according to an example embodiment of the present disclosure.
Figure 2:
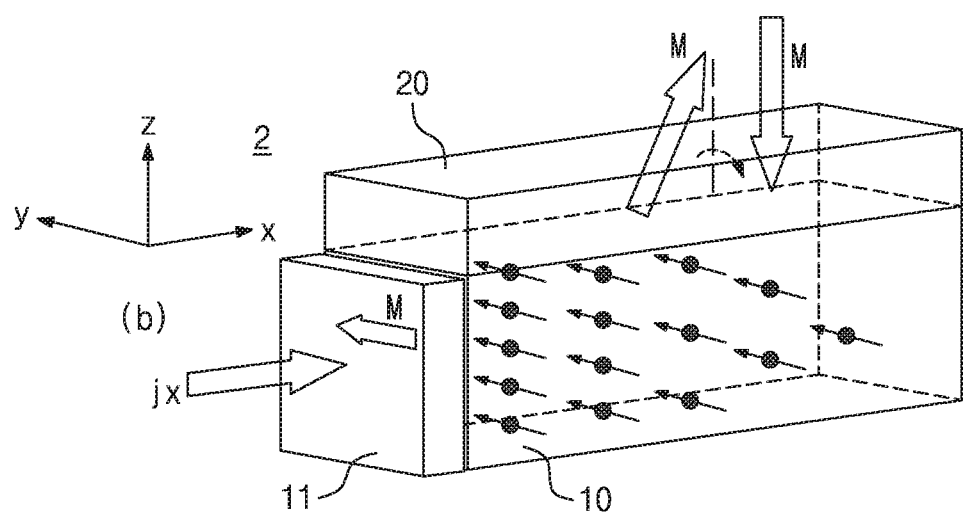
Figure 2:
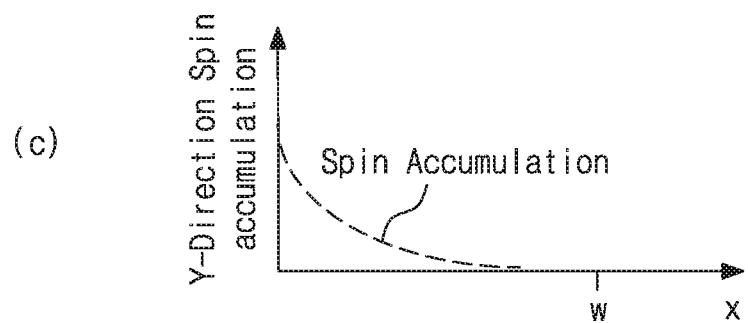

FIG. 2 is a conceptual diagram of a magnetic device including a spin filter structure according to an example embodiment of the present disclosure.

Referring to FIG. 2, a magnetic device 2 includes a conductive layer 10 into which current is injected in a first direction (x axis direction) and which cause spin Hall effect or Rashba effect, a ferromagnetic layer 20 which is disposed in contact with the conductive layer 10 such that the ferromagnetic layer 20 and the conductive layer 10 are staked on each other and whose magnetization direction is switched, and a spin filter structure 11 which has a fixed magnetization direction and is disposed on at least one of opposite side surfaces of the first direction (x axis direction) of the conductive layer 10 to inject spin-polarized current into the conductive layer 10. Spin polarization (SP) of the spin filter structure 11 may be greater than 0 and equal to or smaller than 1. The spin filter structure 11 may be a half-metallic ferromagnet.

The conductive layer 10 and the ferromagnetic layer 20 are stacked on each other, and the conductive layer 10 extends in the x axis direction (first direction) and has first-direction width and thickness. The conductive layer 10 and the ferromagnetic layer 20 may be aligned in a vertical (z axis) direction. The spin filter structure 11 having a ferromagnetism of a fixed magnetic direction is disposed at one end of the x axis direction of the conductive layer 10. The magnetization direction of the spin filter structure 11 may be a y axis direction. A length of the spin filter structure 11 is L. A thickness of the spin filter structure 11 may be equal to that of the conductive layer 10. Current flows in the x axis direction, and the z axis direction is a thickness direction of the ferromagnetic layer 20. An interface between the conductive layer 10 and the ferromagnetic layer 20 is z=0. A width and a thickness of the first direction of the conductive layer 10 are w and $t_N$, respectively. A width and a thickness of the first direction of the ferromagnetic layer 20 are w and $t_F$, respectively. The conductive layer 10 may receive spin-polarized current aligned in the magnetization direction of the spin filter structure by the spin filter structure.

The conductive layer 10 may cause spin Hall effect or Rashba effect. The conductive layer 10 may include a non-magnetic metal or a half-metallic material. The non-magnetic metal may cause spin Hall effect and may be tungsten (W), tantalum (Ta) or platinum (Pt). The half-metallic material may cause spin Hall effect and may be PtMn, IrMn or FeMn.

For example, the spin-polarized current of the y axis direction may generate spin Hall effect by impurity scattering of the conductive layer 10 to provide electrons aligned along y axis to a top surface of the conductive layer 10 and to provide electrons aligned along −y axis to a bottom surface of the conductive layer 10. Spin accumulation disposed on the top surface of the conductive layer 10 may cause a spin-orbit torque to reverse the magnetization direction of the ferromagnetic layer 20.

An auxiliary conductive layer may be connected to the spin filter structure to supply current to the spin filter structure. The auxiliary conductive layer may be a material having a higher electric conductivity than the conductive layer 10.

The ferromagnetic layer 20 may include a ferromagnet having a switched magnetization direction. The ferromagnetic layer 20 may include at least one of Fe, Co, Ni, and Gd.

The ferromagnetic layer 20 may a multilayer thin film including a combination thereof. The ferromagnetic layer 20 may include CoFeB. The ferromagnetic layer 20 may be magnetized in an out-of-plane direction having perpendicular magnetic anisotropy.

The spin filter structure 11 may be a half-metallic ferromagnet. The half-metallic ferromagnet may include at least one of a Heusler alloy, magnetite ($Fe_3O_4$), and lanthanum strontium manganite (LSMO). The spin filter structure 11 may be a half metal whose spin polarization is equal to 1 (SP=1). When the spin filter structure 11 has one spin state at an energy level of a half metal while a majority band and a minority band are separated from each other, the spin filter structure 11 is a conductor in which electrons flow smoothly. However, when the spin filter structure 11 has an opposite pin state, the spin filter has nonconductor or semiconductor characteristics.

Examples of the half-metallic ferromagnet are materials such as Heusler alloy, magnetite ($Fe_3O_4$) and alloy, and lanthanum strontium manganite (LSMO) and alloy. Examples of the Heusler alloy are as follows:

$Cu_2MnAl$, $Cu_2MnIn$, $Cu_2MnSn$,
$Ni_2MnAl$, $Ni_2MnIn$, $Ni_2MnSn$, $Ni_2MnSb$, $Ni_2MnGa$
$Co_2MnAl$, $Co_2MnSi$, $Co_2MnGa$, $Co_2MnGe$, $Co_2NiGa$
$Pd_2MnAl$, $Pd_2MnIn$, $Pd_2MnSn$, $Pd_2MnSb$
$Co_2FeSi$, $Co_2FeAl$
$Fe_2VAl$
$Mn_2VGa$, $Co_2FeGe$

The spin filter structure 11 may be a ferromagnet whose spin polarization is greater than 0.5 (SP>0.5). Spin splitting efficiency may increase in proportion to a value of the spin polarization (SP). The spin filter structure 11 may include a ferromagnet, and a magnetization direction of the spin filter structure 11 may be perpendicular (y axis direction) to an extending direction (y axis direction) of the non-magnetic layer. Accordingly, the spin filter structure 11 may receive in-plane current to provide electrons having a spin direction of the y axis direction.

[Model Calculation Method]

First, we calculate spin accumulation with respect to an SF/NM structure. The "SF" represents the spin filter structure 11, and the "NM" represents a non-magnetic layer or the conductive layer 10. In this calculation, the magnetic layer 20 was neglected (interface scattering was neglected at an SF/NM interface). If a spin filter drift-diffusion equation is solved to the SF/NM interface, we can obtain a y-element of spin accumulation at the non-magnetic layer.

$$\mu_y^s(x) = \beta e l_{sf}^F \frac{\rho_F \exp(-x/l_{sf}^N)}{\rho_F + \rho_N \coth(L/2l_{sf}^F)} E_x \quad \text{Equation (1)}$$

In the Equation (1), $\rho_F$ represents a resistivity of a spin filter structure (SF) having a fixed magnetization direction, $\rho_N$ represents a resistivity of a non-magnetic layer NM, L represents a length of the spin filter structure, $l_{sf}^F$ and $l_{sf}^N$ represent spin-flip diffusion lengths of the spin filter structure 11 formed of a ferromagnet and the non-magnetic layer NM, respectively, $E_x$ represents an electric field applied in an x axis direction, and $\beta(0<\beta\le 1)$ represents a spin polarization of the spin filter structure 11. For the reference, x=0 is selected as an interface of spin filter structure/non-magnetic metal layer.

Next, we concentrate on an NM/FM structure. The NM represents a non-magnetic layer, and the FM represents a ferromagnetic layer. When we apply an external electric field in the x axis direction, charge and spin current densities flowing in z axis direction are given as follows.

$$j_z = \frac{\sigma}{e}\partial_z\bar{\mu} - \frac{\sigma_{SH}}{e}\delta_{ij}\partial_i\mu_j^s \text{ and} \quad \text{Equation (2)}$$

$$j_{i,z}^s = \frac{\sigma}{e}\partial_z\mu_i^s + \frac{\sigma_{SH}}{e}\delta_{ij}\partial_j\bar{\mu}.$$

In the Equation (2), i and j represent components of a coordinate system, respectively, σ represents an electric conductivity, e represents charge amount of electron, $\bar{\mu}$ represents an electrochemical potential, $\mu_j^s$ represents j-component spin accumulation having a polarization direction, $\sigma_{SH}$ a spin Hall electric conductivity of the non-conductivity, and $\varepsilon_{ij}$ represents a Levi-Civita symbol used usually in mathematics and physics.

For clarity, we make it clear in advance that the definition of spin current of the Equation (2) is different from a conventional definition $Q_{i,z}^s=-(\hbar/2e)j_{i,z}^s$, by a constant multiple. Subscripts i and z denote spin polarization direction and flow direction of the spin current, respectively. With respect to the ferromagnetic layer 20, an equation for charge and spin current is given as follows.

$$j_z = \frac{\sigma}{e}\partial_z\bar{\mu} + \beta_0 \hat{M} \cdot \partial_z\mu^s \text{ and} \quad \text{Equation (3)}$$

$$j_{i,z}^s = \frac{\sigma}{e}\beta_0 \hat{M}_i\partial_z\bar{\mu} + \frac{\sigma_{SH}}{e}\partial_z\mu_i^s$$

In the Equation (3), $\hat{M}$ represents a unit vector along the magnetization and $\beta_0$ represents spin polarization of the ferromagnetic layer 20.

The spin filter structure 11 provides additional spin accumulation to the non-magnetic layer. The spin accumulation decreases exponentially in the x axis direction. It is difficult to obtain an analytical solution to a two-dimensional spin diffusion equation. Accordingly, we approximately obtain ansatz with respect to the spin accumulation from the non-magnetic layer NM by simply adding average spin accumulation from the spin filter structure 11 to a value of diffusion equation in the z axis direction.

$$\mu_i^S(x,z)=A_i\exp(z/l_{ij}^N)+B_i\exp(-z/l_{ij}^N)+K, \quad \text{Equation (4)}$$

We use an approximation, as follows.

$$K = \frac{\beta e E_x l_{sf}^F \rho_F}{\rho_F + \rho_N \coth(L/2l_{sf}^F)} \frac{1}{w}\int_0^w dx \exp(-x/l_{sf}^N)$$

In the equation above, w represents a width of the non-magnetic layer and we obtain $j_z=(\sigma/e)\partial_z\bar{\mu}$ from the equations (2) and (4). We assume that a sample is infinite in the y axis direction and thin enough in the z axis direction. In the case of a normal state ($j_x$=constant, $j_z$=0), a continuity equation $\nabla\cdot j=\partial_z j_z=0$ induces $\partial_z^2\bar{\mu}=0$. A value of this equation is $\bar{\mu}=Cz+F(x)$, where C represents a constant and F(x) represents external electric field contribution (F(x)~$eE_x$x). In the case that current flowing in the z axis direction is zero ($j_z$=0), the current is given as follows.

$$\int j_z dz = \frac{\sigma}{e}\bar{\mu} = G \quad \text{Equation (5)}$$

The above equation is expressed as follows.

$$\bar{\mu} = eE_x x \quad \text{Equation (6)}$$

If the equations (2), (4), and (6) are used, we obtain the following equation.

$$j_{i,z}^s = \frac{\sigma}{el_{sf}^N}(A_i \exp(z/l_{sf}^N) + B_i \exp(-z/l_{sf}^N)) + \sigma_{SH} E_x \delta_{i,y} \quad \text{Equation (7)}$$

At the NM/FM interface, charge and spin current are given as follows.

$$j_z = (G_\uparrow + G_\downarrow)(\Delta\bar{\mu}/e) + (G_\uparrow - G_\downarrow)(\hat{M} \cdot \Delta\mu_s/e), \quad \text{Equation (8)}$$

$$(\vec{j}_z^s)_T = -\frac{1}{e}\left[\frac{\text{Re}(G_{\uparrow\downarrow})}{e}(2\Delta\mu_s \times \hat{M}) \times \hat{M} + \frac{\text{Im}(G_{\uparrow\downarrow})}{e}(2\Delta\mu_s \times \hat{M})\right],$$

$$(\vec{j}_z^s)_L = \frac{1}{e}\left[(G_\uparrow + G_\downarrow)\hat{M} \cdot \Delta\mu_s + (G_\uparrow - G_\downarrow)\Delta\bar{\mu}\right],$$

In the equation (8), subscripts T and L represent a transversal component and a longitudinal component, respectively, $G_\uparrow(G_\downarrow)$ represents an interface conductivity of a majority (minority) spin, and $G_{\uparrow\downarrow}$ represents a spin mixing conductance.

Also, in the equation (8), $\Delta\bar{\mu}(\Delta\mu_s)$ represents a charge (spin) chemical potential drop. We assume that a spin dephasing length is very short at the ferromagnetic layer and thus perpendicular spin current $(j_z^s)_T$ is completely absorbed at the NM/FM interface. As a result, the spin torque is described as follows.

$$\frac{\partial M}{\partial t} = -\frac{\hbar}{2e}\frac{\gamma}{\mu_0 M_s t_F}(0 - \vec{j}_z^s)_T \quad \text{Equation (9)}$$

In the equation (9), $\gamma$ represents a gyromagnetic ratio and $M_s$ represents a magnetization per unit volume. The spin torque is described as a damping like torque and a field-like torque.

$$\frac{\partial \hat{M}}{\partial t} = -T_D \hat{M} \times (\hat{M} \times \hat{y}) - T_F \hat{M} \times \hat{y} \quad \text{Equation (10)}$$

In the equation (10), $T_D$ ($T_F$) represents a coefficient of a damping-like (field-like) torque. If the above bulk equation is solved at a top surface ($z=t_F$) of the ferromagnetic layer and a bottom surface ($z=-t_N$) of the non-magnetic layer under the interface condition ($j_z=0$ and $j_z^s=0$), we obtain equations as follows.

Equation (11) and Equation (12)

$$T_D = \frac{\hbar}{2e}\frac{\gamma}{\mu_0 M_s t_F}\left\{\theta_{SH}\sigma E_x \frac{(1-e^{-t_N/l_{sf}^N})^2}{1+e^{-2t_N/l_{sf}^N}} + \frac{\sigma}{el_{sf}^N}K\tanh(t_N/l_{sf}^N)\right\} \times \frac{|\tilde{G}^{\uparrow\downarrow}|^2 + \text{Re}(\tilde{G}^{\uparrow\downarrow})\tanh^2(t_N/l_{sf}^N)}{|\tilde{G}^{\uparrow\downarrow}|^2 + 2\text{Re}(\tilde{G}^{\uparrow\downarrow})\tanh^2(t_N/l_{sf}^N) + \tanh^4(t_N/l_{sf}^N)}, \text{ and} \quad (11)$$

$$T_F = -\frac{\hbar}{2e}\frac{\gamma}{\mu_0 M_s t_F}\left\{\theta_{SH}\sigma E_x \frac{(1-e^{-t_N/l_{sf}^N})^2}{1+e^{-2t_N/l_{sf}^N}} + \frac{\sigma}{el_{sf}^N}K\tanh(t_N/l_{sf}^N)\right\} \times \frac{\text{Im}(\tilde{G}^{\uparrow\downarrow})\tanh^2(t_N/l_{sf}^N)}{|\tilde{G}^{\uparrow\downarrow}|^2 + 2\text{Re}(\tilde{G}^{\uparrow\downarrow})\tanh^2(t_N/l_{sf}^N) + \tanh^4(t_N/l_{sf}^N)}, \quad (12)$$

In the equations (11) and (12), $\theta_{SH}=\sigma_{SH}/\sigma$ represents the amount defined as a spin Hall angle and $\tilde{G}^{\uparrow\downarrow}=G^{\uparrow\downarrow}\{2 l_{sf}^N \tan h(t_N/l_{sf}^N)\}/\sigma$. Also, in the equations (11) and (12), a spin torque localized at the NM/FM interface is averaged with respect to a thickness of the ferromagnetic layer $t_F$. A first term of each torque corresponds to a spin Hall contributory portion when the spin Hall structure 11 does not exist.

The effect of the spin filter structure is reflected in the second term. Spins are partially polarized at the non-magnetic layer NM by the spin filter structure 11. Accordingly, even when there is no spin Hall effect, a non-zero spin chemical potential drop is induced at the NM/FM interface to produce a spin torque. Spin accumulation caused by the spin filter structure 11 applies a torque to the ferromagnetic layer 20 even when there is no direct current-flow perpendicular to the interface. This type of spin torque was experimentally observed in a non-local geometry and is a lateral spin torque caused by inhomogeneous magnetization.

Figure 3:
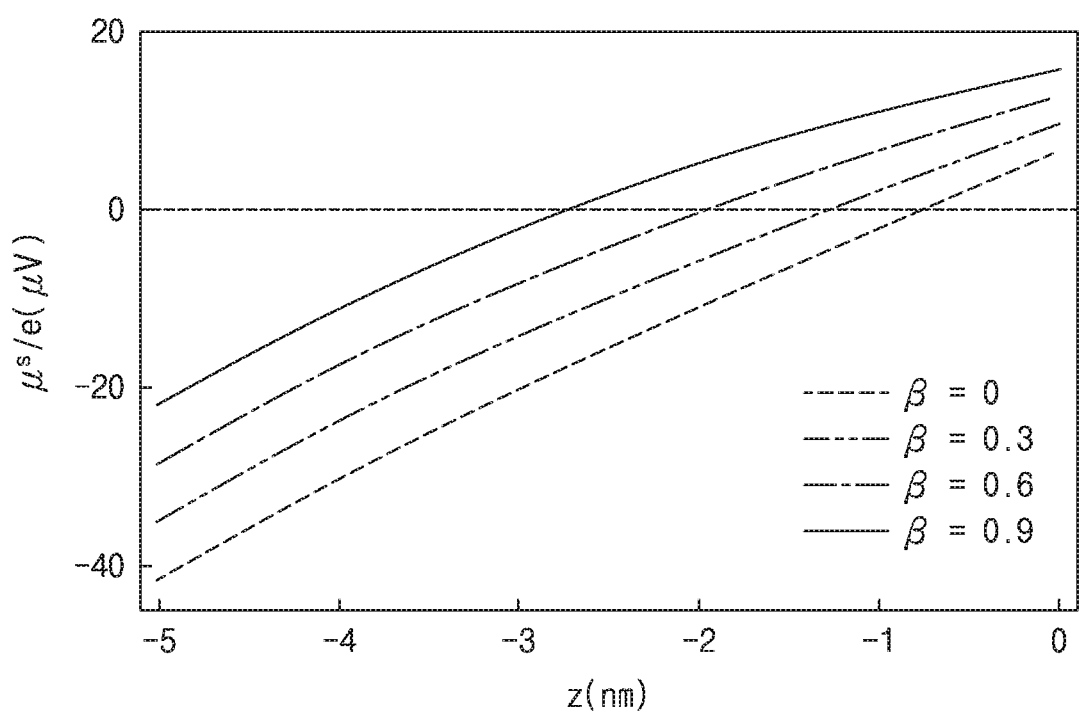
FIG. 3 illustrates position-dependent spin accumulation at the magnetic device in FIG. 2.

FIG. 3 illustrates position-dependent spin accumulation at the magnetic device in FIG. 2.

Referring to FIG. 3, the following parameters were used in a simulation. A non-magnetic layer NM is platinum (Pt), and a spin filter structure 11 is cobalt (Co).

$\sigma_F=5\times10^6$ m$^{-1}\Omega^{-1}$, $\sigma_N=5\times10^6$ m$^{-1}\Omega^{-1}$, $f_{sf}=38$ nm, $l_{sf}^N=1-10$ nm, $\text{Re}[G^{\uparrow\downarrow}]=5.94\times10^{14}$ m$^{-2}\Omega^{-1}$, and $\text{Im}[G^{\uparrow\downarrow}]=0.86\times10^{14}$ m$^{-2}\Omega^{-1}$. An electric field applied to the non-magnetic layer NM is $E_x=2\times10^4$ V/m, and a charge current density in the x direction is approximately $\sigma_N E_x \cong 10^{11}$ A/m$^2$. The other parameters were selected as follows. A magnetization of the ferromagnetic layer 10 was $M_s=1.0$ MA/m, a length of the spin filter structure 11 was L=20 nm, a spin Hall angle of the non-magnetic layer used $\theta_{SH}=0-0.9$, and a spin polarization of the spin filter structure 11 used $\beta=0-1.0$.

FIG. 3 shows y-component spin accumulation $\mu_y^s$ in NM of NM(5 nm)/FM(1.5 nm) structure with respect to $\theta_{SH}=0.3$. At an upper edge (z=0), the net amount of the spin accumulation increases as spin polarization $\beta$ increases. This causes a spin torque to increase in the equations (11) and (12).

Figure 4:
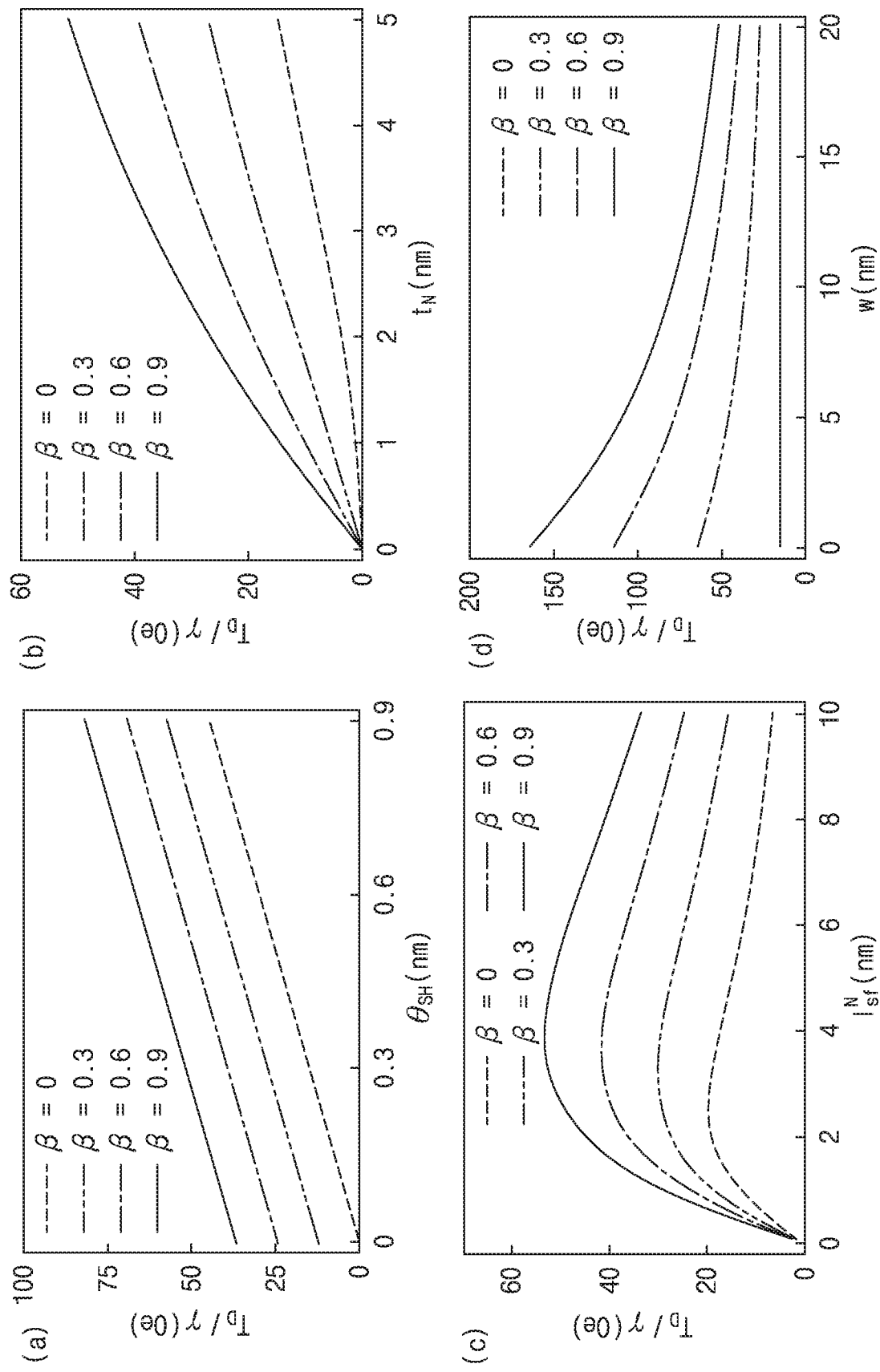
FIG. 4 illustrates dependencies of a damping-like spin torque $T_D$ on four parameters $\theta_{SH}$, $t_N$, $l_{sf}^N$, and w.

FIG. 4 illustrates dependencies of a damping-like spin torque $T_D$ on four parameters $\theta_{SH}$, $t_N$, $l_{sf}^N$, and w.

Referring to FIG. 4, resulting damping-like spin torques increases according to an increasing spin Hall angle $\theta_{SH}$. The damping-like spin torque increases according to a thickness of a non-magnetic layer NM $t_N$. The damping-like spin torque exhibits a maximum according to a spin-flip diffusion length $l_{sf}^N$. A spin-flip diffusion length of the non-magnetic layer NM may be between 3 and 4 nm.

An additional spin torque from the spin polarization decays in an x direction. With respect to non-zero spin polarization $\beta$, the damping-like spin torque increases to a width w of the non-magnetic layer NM. The spin polarization increases the damping-like spin torque.

Figure 5:
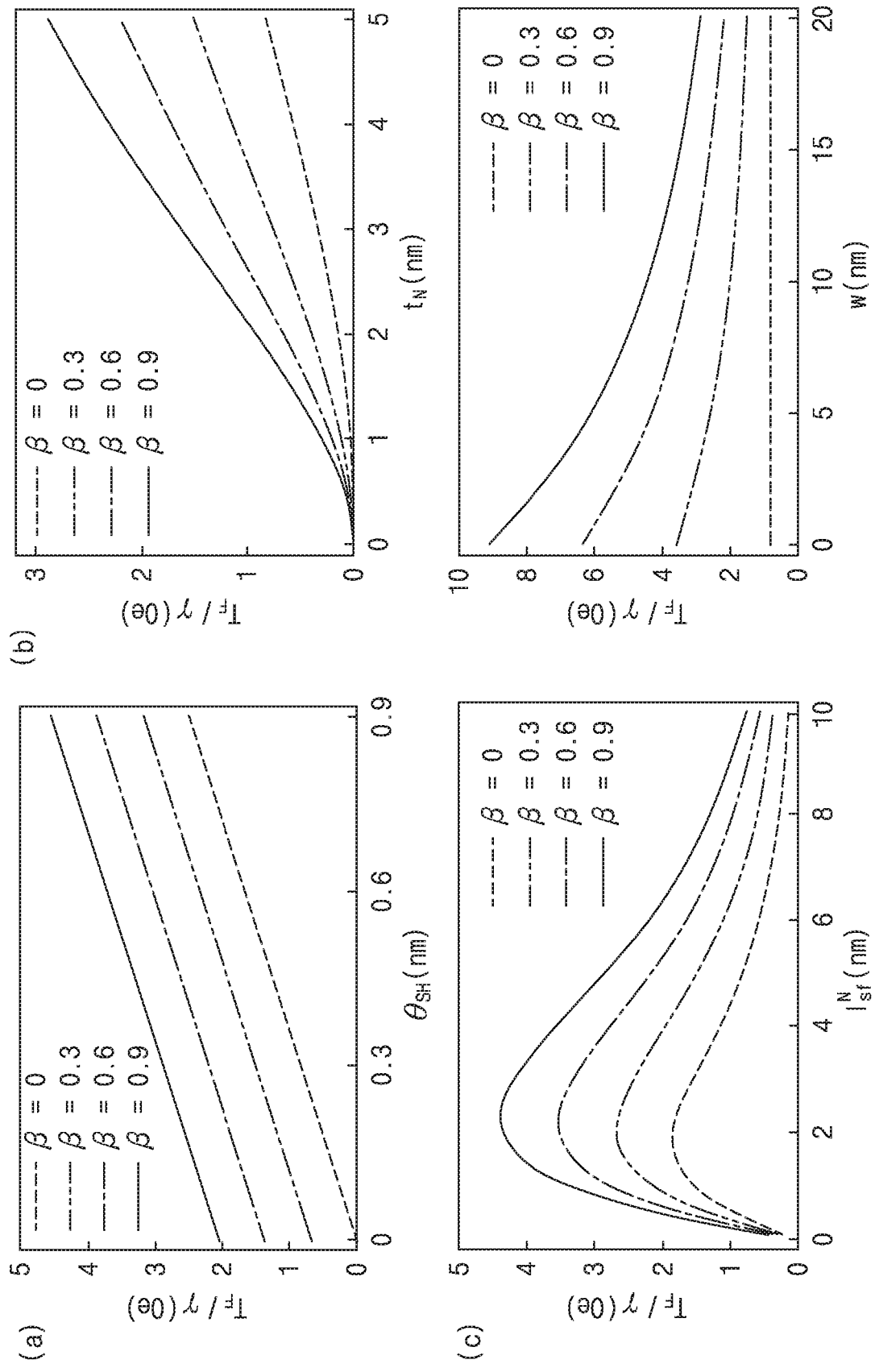
FIG. 5 illustrates dependencies of a field-like spin torque $T_F$ on four parameters $\theta_{SH}$, $t_N$, $l_{sf}^N$, and w.

FIG. 5 illustrates dependencies of a field-like spin torque $T_F$ on four parameters $\theta_{SH}$, $t_N$, $l_{sf}^N$, and w.

Referring to FIG. 5, the field-like spin torque $T_F$ is 10 times smaller than the damping-like spin torque $T_D$. This is because $\text{Im}[G^{\uparrow\downarrow}]$ is smaller than $\text{Re}[G^{\uparrow\downarrow}]$ in parameterization. The dependencies of the field-like spin torque on the four parameters $\theta_{SH}$, $t_N$, $l_{sf}^N$, and w are similar to each other.

Figure 6:
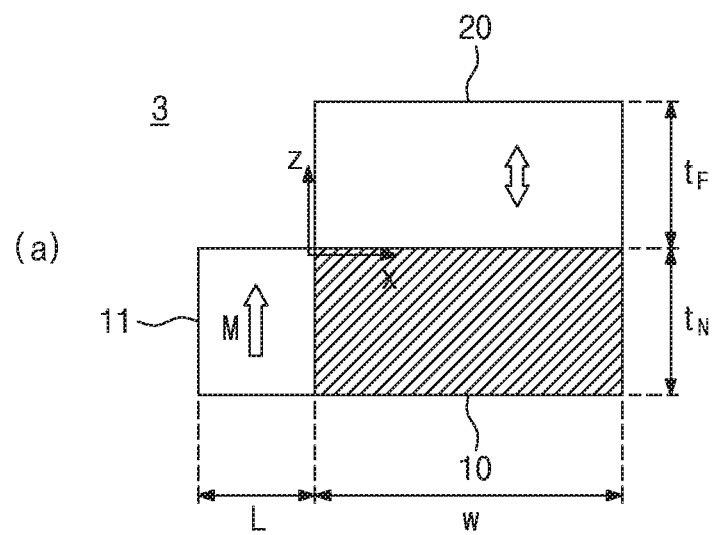
FIG. 6 is a conceptual diagram of a magnetic device including a spin filter structure according to another example embodiment of the present disclosure.
Figure 6:
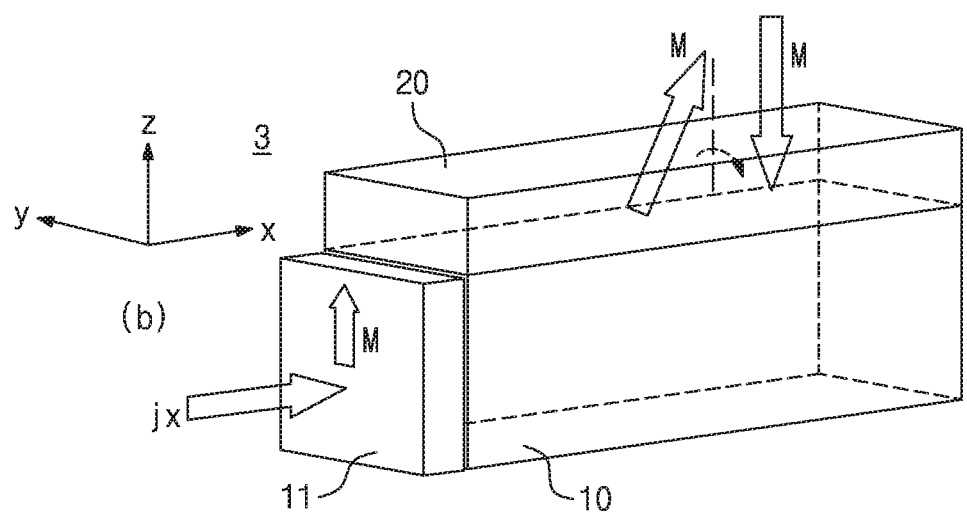
Figure 6:
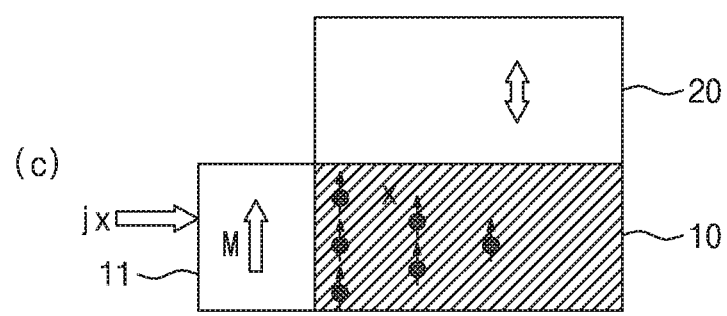

FIG. 6 is a conceptual diagram of a magnetic device including a spin filter structure according to another example embodiment of the present disclosure.

Referring to FIG. 6, a magnetic device 3 includes a conductive layer 10 into which current is injected in a first direction and which cause spin Hall effect or Rashba effect, a ferromagnetic layer 20 which is disposed in contact with the conductive layer 10 such that the ferromagnetic layer 20 and the conductive layer 10 are staked on each other and whose magnetization direction is switched, and a spin filter structure 11 which has a fixed magnetization direction and is disposed on at least one of opposite side surfaces of the first direction of the conductive layer 10 to inject spin-polarized current into the conductive layer 10.

A magnetization direction of the spin filter structure 11 may be a direction (z axis direction) perpendicular to a plane on which the conductive layer 10 is disposed. A magnetization direction of the ferromagnetic layer 20 may be an out-of-plane direction having perpendicular magnetization anisotropy.

A spin polarization of the spin filter structure 11 may be between 0.5 and 1. The spin filter structure 11 may be half-metallic ferromagnet. The half-metallic ferromagnet may include at least one of a Heusler alloy, magnetite ($Fe_3O_4$), and lanthanum strontium manganite (LSMO). The spin filter structure 11 may include a ferromagnet, and a magnetization direction of the spin filter structure 11 is perpendicular to a plane on which the conductive layer 10 is disposed. When the magnetization direction of the spin filter structure 11 is aligned in the z axis direction, the ferromagnetic layer 20 having perpendicular magnetic anisotropy may be deterministically switched without an external magnetic field by a spin polarization flowing to the conductive layer 10.

Figure 7:
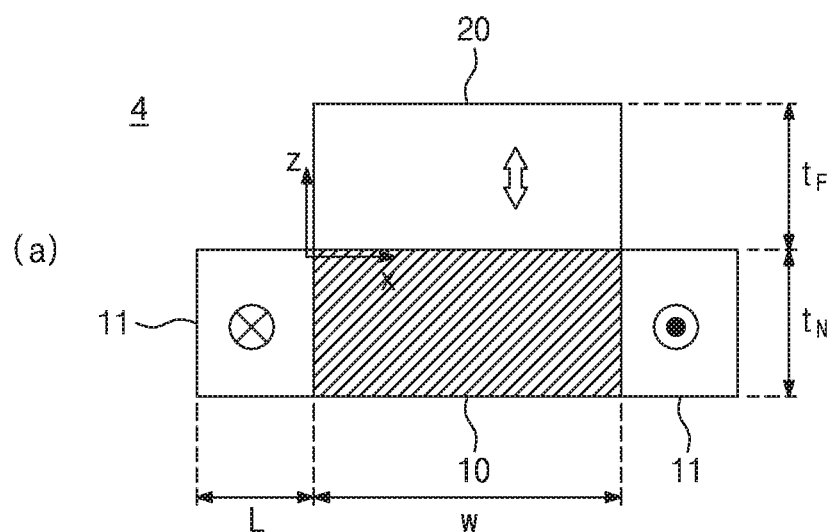
FIGS. 7 through 9 illustrate magnetic devices according to other example embodiments of the present disclosure, respectively.
Figure 7:
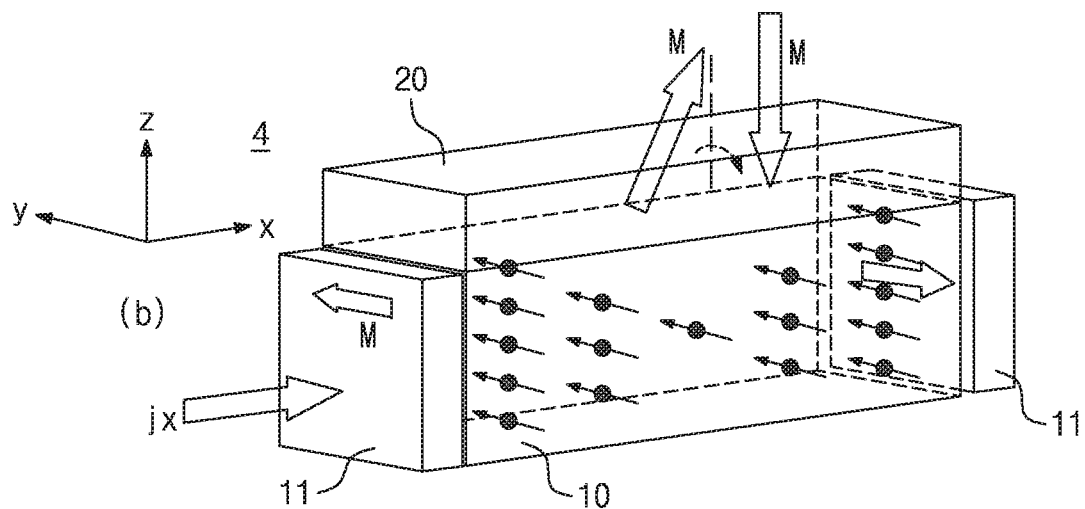
Figure 7:
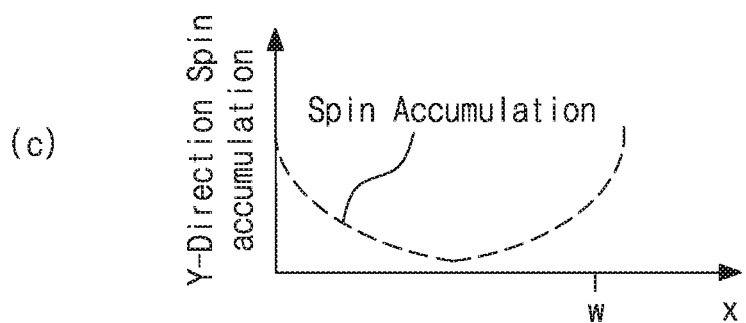

FIG. 7 illustrates a magnetic device according to another example embodiment of the present disclosure.

Referring to FIG. 7, a magnetic device 4 includes a conductive layer 10 into which current is injected in a first direction and which cause spin Hall effect or Rashba effect, a ferromagnetic layer 20 which is disposed in contact with the conductive layer 10 such that the ferromagnetic layer 20 and the conductive layer 10 are staked on each other and whose magnetization direction is switched, and a spin filter structure 11 which has a fixed magnetization direction and is disposed on at least one of the opposite side surfaces of the first direction of the conductive layer 10 to inject spin-polarized current into the conductive layer 10.

The spin filter structure 11 may be disposed at opposite side surfaces of the first direction of the non-magnetic layer 10. A magnetization direction (+y axis direction) of the spin filter structure 11 disposed left may be −y axis direction to be antiparallel to a magnetization direction of the spin filter structure 11 disposed right. Accordingly, spin accumulation of y axis direction may have a symmetrical (even) function form. The spin accumulation of y axis direction caused by the spin-polarized current provides a spin torque to the ferromagnetic layer 20. In addition, the ferromagnetic layer 20 having perpendicular magnetic anisotropy may cause spin accumulation aligned in the y axis direction which results from scattering of the spin-polarized current, and y-direction spin accumulation resulting from spin Hall effect may provide an additional spin torque to the ferromagnetic layer 20.

Figure 8:
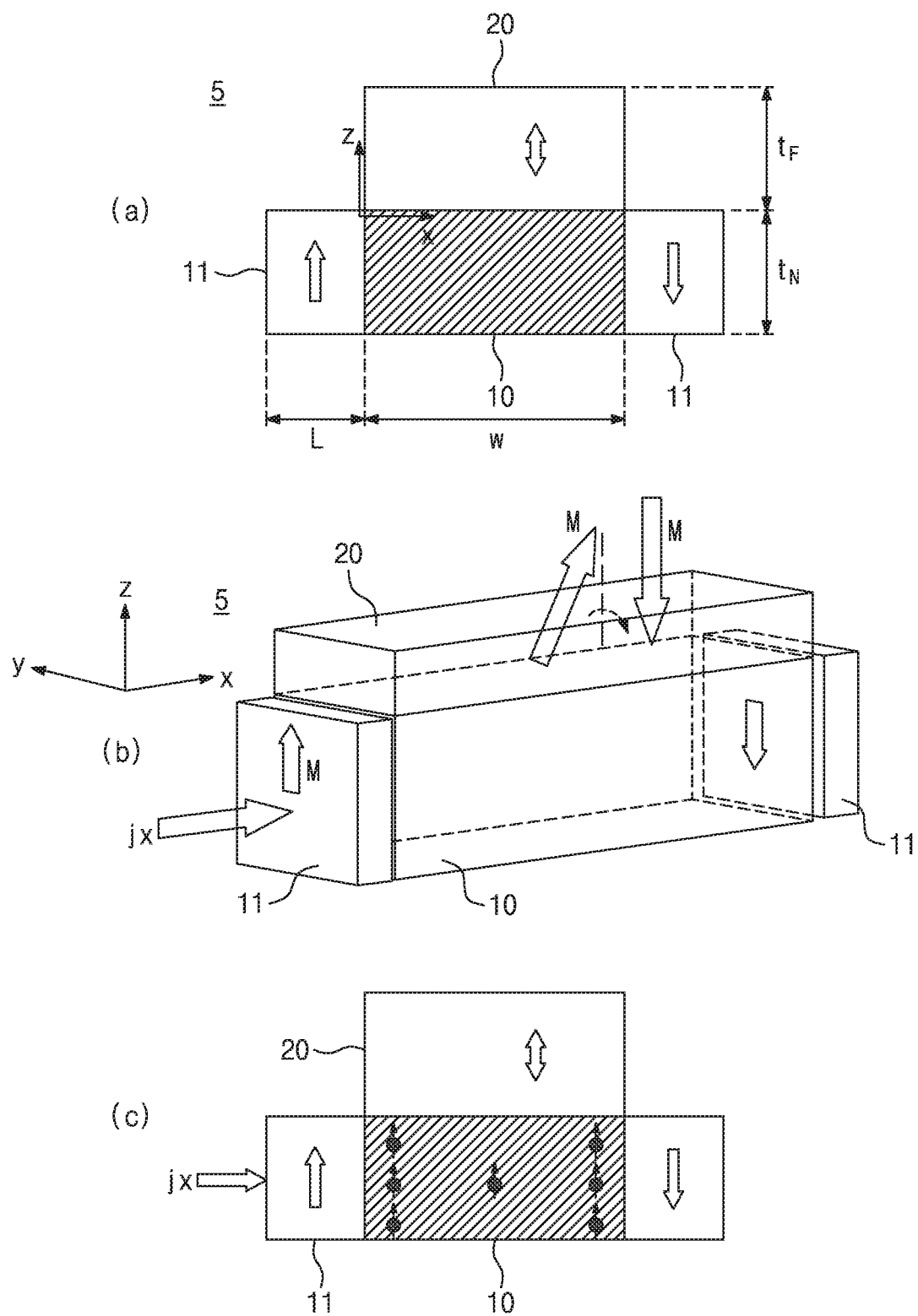

FIG. 8 illustrates a magnetic device according to another example embodiment of the present disclosure.

Referring to FIG. 8, a magnetic device 5 includes a conductive layer 10 into which current is injected in a first direction and which cause spin Hall effect or Rashba effect, a ferromagnetic layer 20 which is disposed in contact with the conductive layer 10 such that the ferromagnetic layer 20 and the conductive layer 10 are staked on each other and whose magnetization direction is switched, and a spin filter structure 11 which has a fixed magnetization direction and is disposed on at least one of opposite side surfaces of the first direction of the conductive layer 10 to inject spin-polarized current into the conductive layer 10. The spin filter structure 11 may be disposed at opposite side surfaces of the first direction of the non-magnetic layer 10. A magnetization direction (+z axis direction) of the spin filter structure 11 disposed left may be −z axis direction to be antiparallel to a magnetization direction of the spin filter structure 11 disposed right. Thus, spin accumulation of y axis direction may have a symmetrical (even) function form. When the magnetization direction of the spin filter structure 11 is aligned in the z axis direction, the ferromagnetic layer 20 having perpendicular magnetic anisotropy may be deterministically without an external magnetic field by a spin polarization flowing to the conductive layer 10.

Figure 9:
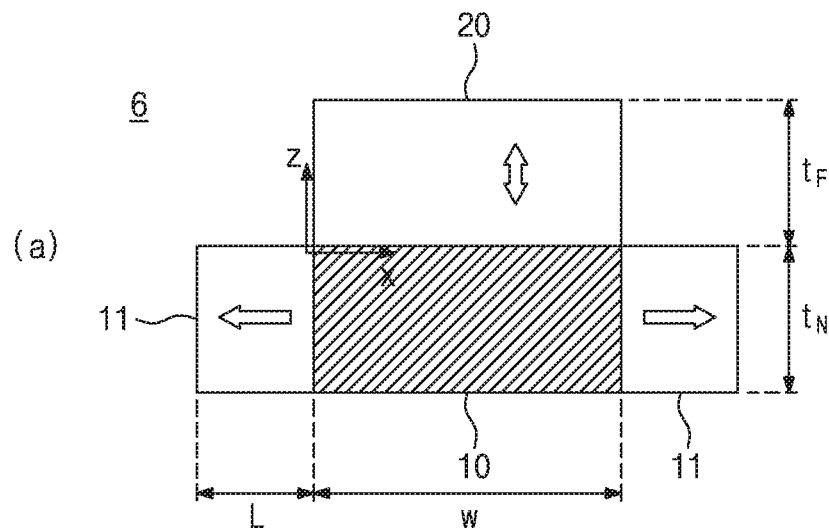
Figure 9:
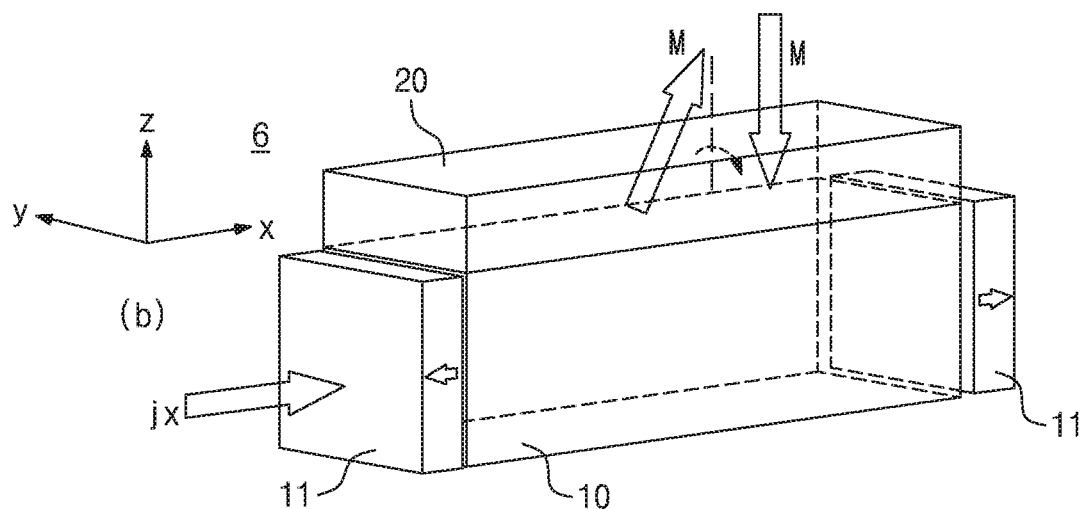
Figure 9:
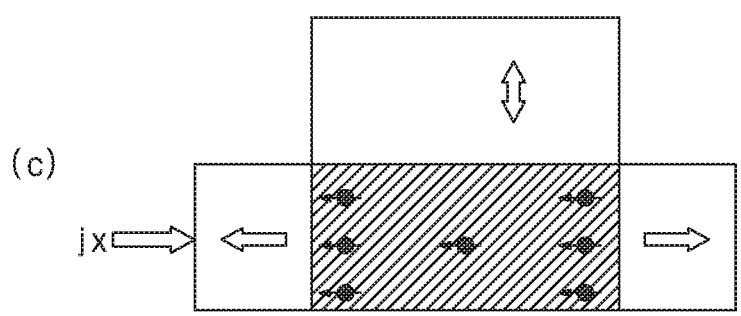

FIG. 9 illustrates a magnetic device according to another example embodiment of the present disclosure.

Referring to FIG. 9, a magnetic device 6 includes a conductive layer 10 into which current is injected in a first direction and which cause spin Hall effect or Rashba effect, a ferromagnetic layer 20 which is disposed in contact with the conductive layer 10 such that the ferromagnetic layer 20 and the conductive layer 10 are staked on each other and whose magnetization direction is switched, and a spin filter structure 11 which has a fixed magnetization direction and is disposed on at least one of opposite side surfaces of the first direction of the conductive layer 10 to inject spin-polarized current into the conductive layer 10. A magnetization direction (−x axis direction) of the spin filter structure 11 disposed left may be +x axis direction to be antiparallel to a magnetization direction of the spin filter structure 11 disposed right. Thus, spin accumulation of x axis direction may have a symmetrical (even) function form. When the magnetization direction of the spin filter structure 11 is aligned in the x axis direction, the ferromagnetic layer 20 having perpendicular magnetic anisotropy may be provided with a spin torque by a spin polarization flowing to the conductive layer 10.

Figure 10:
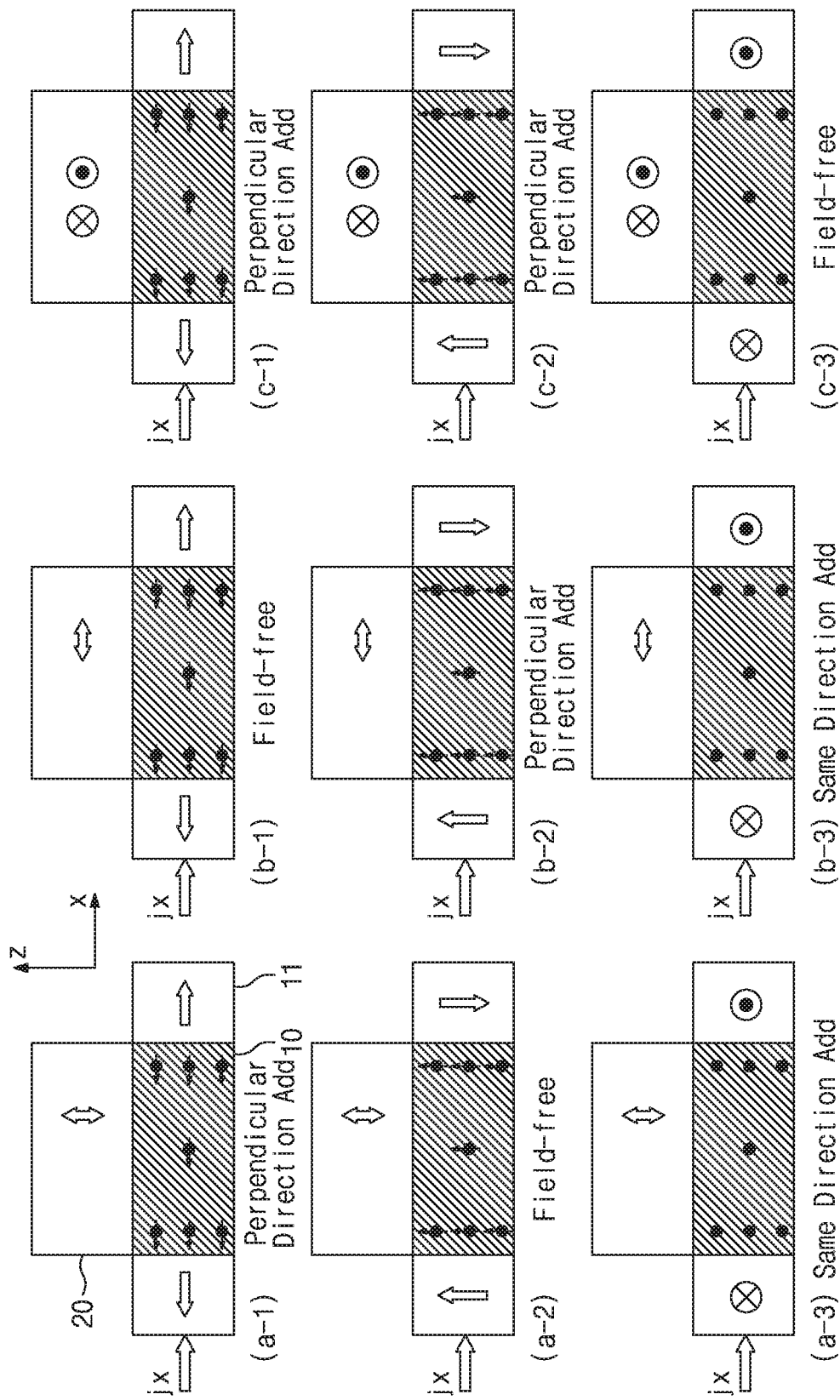
FIG. 10 illustrates spin accumulation depending on magnetization directions of a spin filter structure and a ferromagnet according to another example embodiment of the present disclosure.

FIG. 10 illustrates spin accumulation depending on magnetization directions of a spin filter structure and a ferromagnet according to another example embodiment of the present disclosure.

Referring to FIG. 10, when a ferromagnetic layer has perpendicular magnetic anisotropy, a magnetization direction of a spin filter structure may be z axis direction to switch the ferromagnetic layer without an external magnetic field (a-2).

In addition, when the ferromagnetic layer has an in-plane magnetization direction and a magnetization of the spin filter structure is the same as that of the ferromagnetic layer, the ferromagnetic layer may be switched without an external magnetic field (b-1 and c-3).

Figure 11:
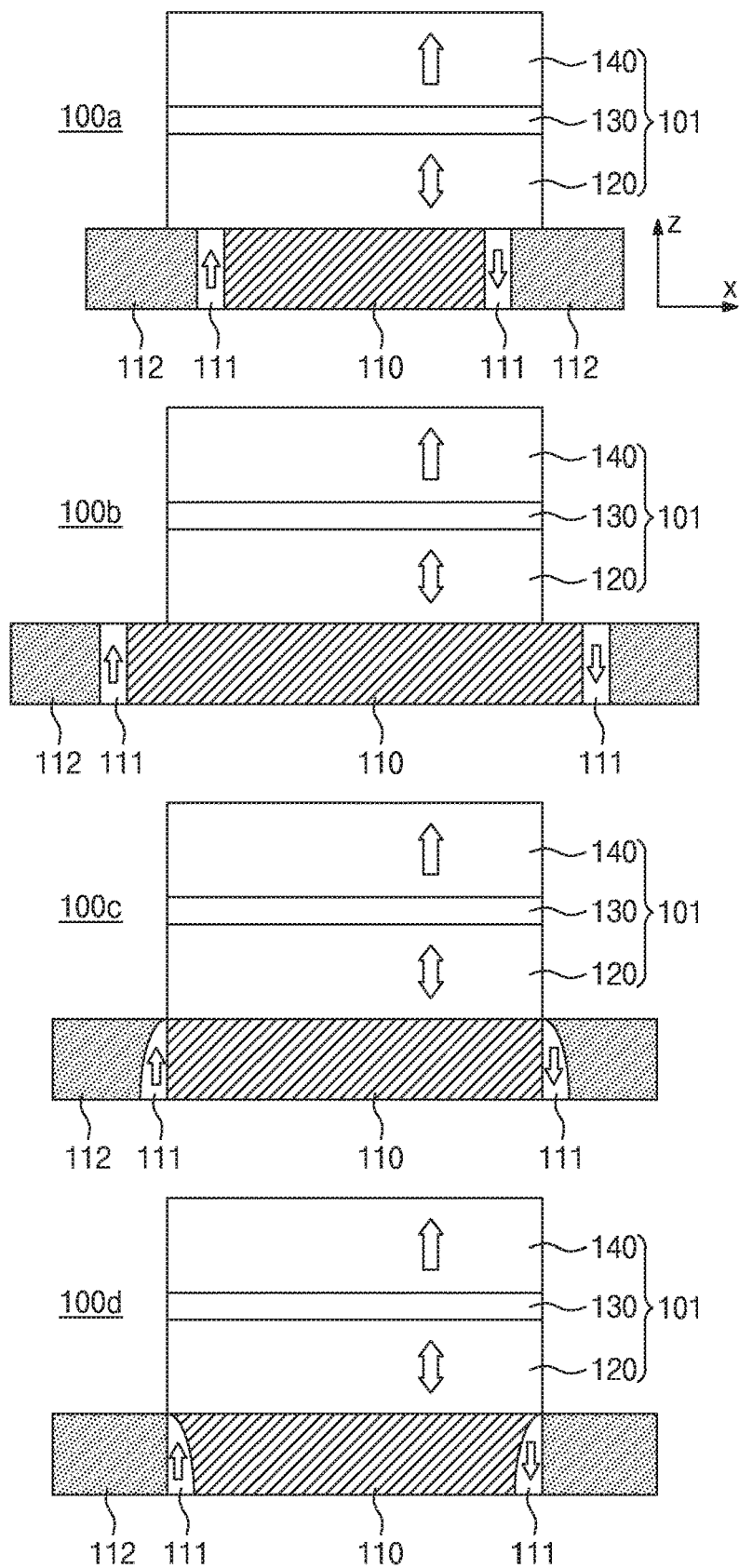
FIG. 11 illustrates magnetic tunnel devices according to another example embodiment of the present disclosure.

FIG. 11 illustrates magnetic tunnel devices according to another example embodiment of the present disclosure.

Referring to FIG. 11, each of magnetic tunnel junction devices 100a to 100d includes a magnetic tunnel junction 101 including a pinned magnetic layer 140, a free magnetic layer 120, and a tunnel barrier layer 130 interposed between the pinned magnetic layer 140 and the free magnetic layer 120, a conductive pattern 110 to which in-plane current flows and which is disposed adjacent to the free magnetic layer 120 to cause spin Hall effect or Rashba effect to apply a spin torque to the free magnetic layer 120 of the magnetic tunnel junction 101, and a spin filter structure 111 disposed on at least one of the opposite side surfaces of the conductive pattern 110 in a direction in which the in-plane current is applied. The spin filter structure 111 filters the injected current to control the amount and direction of a spin and supplies the filtered current to the conductive pattern 110.

The magnetic tunnel junction devices 100a to 100d constitute a portion of a magnetic memory cell. A conductive pattern 110, a free magnetic layer 120, a tunnel barrier layer 130, and a pinned magnetic layer 140 are sequentially stacked on a substrate. The pinned magnetic layer 140 may be connected to a wiring. The conductive pattern 110 may supply in-plane current and may cause spin Hall effect or Rashba effect. The spin filter structure 111 may be disposed on at least one side surface of the conductive pattern 110 in a direction in which the in-plane current flows. An auxiliary conductive pattern 112 may be connected to the spin filter structure 111. The in-plane current may flow through the auxiliary conductive pattern 112, the spin filter structure 111, and the conductive pattern 110. The spin filter structure 111 may supply spin-polarized current to the conductive pattern 110, and the conductive pattern 110 may provide a spin orbit torque to the free magnetic layer 120 due to spin Hall effect or Rashba effect to lead to magnetization reversal. In addition, the spin filter structure 111 may provide spin accumulation aligned in a magnetization direction of the spin filter structure 111 and the spin accumulation may provide a deterministic switching effect or an effect to provide an additional torque.

The free magnetic layer 120 may be aligned perpendicularly to the conductive pattern 110. Alternatively, according to a modified embodiment of the present disclosure, the conductive pattern 112 may not be aligned perpendicularly to the free magnetic layer 120. The spin filter structure 111 may be disposed to have a portion that is in contact with the free magnetic layer 120 or may be disposed not to have a portion that is in contact with the free magnetic layer 120. The spin filter structure 111 may be formed by a conventional patterning process to have a corner or may be a sidewall spacer structure formed by a conformal deposition process or an anisotropic etching process.

Figure 12:
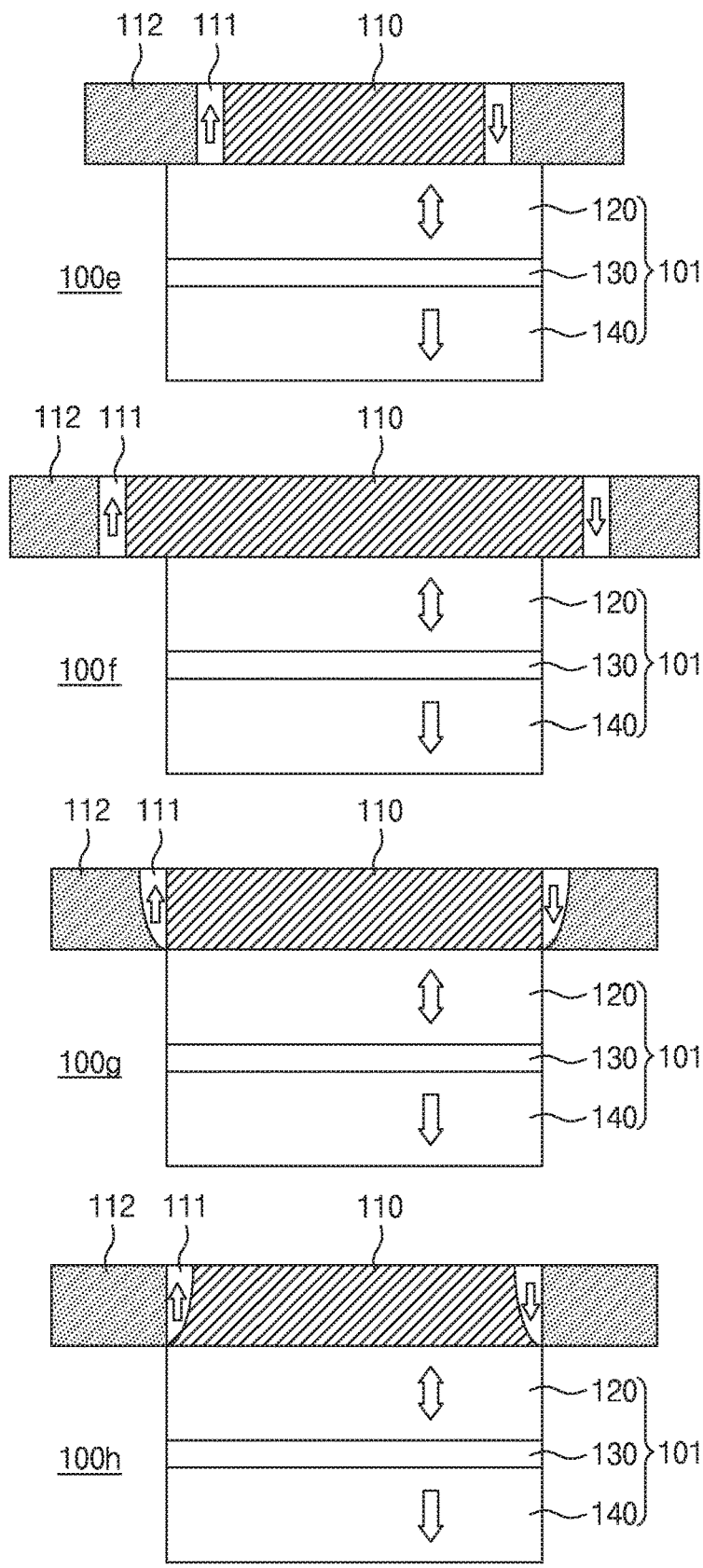
FIG. 12 illustrates magnetic tunnel devices according to another example embodiment of the present disclosure.

FIG. 12 illustrates magnetic tunnel devices according to another example embodiment of the present disclosure.

Referring to FIG. 12, each of magnetic tunnel junction devices 100e to 100h includes a magnetic tunnel junction 101 including a pinned magnetic layer 140, a free magnetic layer 120, and a tunnel barrier layer 130 interposed between the pinned magnetic layer 140 and the free magnetic layer 120, a conductive pattern 110 to which in-plane current flows and which is disposed adjacent to the free magnetic layer 120 to cause spin Hall effect or Rashba effect to apply a spin torque to the free magnetic layer 120 of the magnetic tunnel junction 101, and a spin filter structure 111 disposed on at least one of the opposite side surfaces of the conductive pattern 110 in a direction in which the in-plane current is applied. The spin filter structure 111 filters the injected current to control the amount and direction of a spin and supplies the filtered current to the conductive pattern 110.

The magnetic tunnel junction devices 100e to 100h constitute a portion of a magnetic memory cell. A conductive pattern 110, a free magnetic layer 120, a tunnel barrier layer 130, and a pinned magnetic layer 140 are sequentially stacked on a substrate. The pinned magnetic layer 140 may be connected to a wiring. The conductive pattern 110 may supply in-plane current and may cause spin Hall effect or Rashba effect. The spin filter structure 111 may be disposed on at least one side surface of the conductive pattern 110 in a direction in which the in-plane current flows. An auxiliary conductive pattern 112 may be connected to the spin filter structure 111. The in-plane current may flow through the auxiliary conductive pattern 112, the spin filter structure 111, and the conductive pattern 110. The spin filter structure 111 may supply spin-polarized current to the conductive pattern 110, and the conductive pattern 110 may provide a spin orbit torque to the free magnetic layer 120 due to spin Hall effect or Rashba effect to lead to magnetization reversal. In addition, the spin filter structure 111 may provide spin accumulation aligned in a magnetization direction of the spin filter structure 111 and the spin accumulation may provide a deterministic switching effect or an effect to provide an additional torque.

A side surface of the free magnetic layer 120 may be aligned perpendicularly to a side surface of the conductive pattern 110. Alternatively, according to a modified embodiment of the present disclosure, the conductive pattern 112 may not be aligned perpendicularly to the free magnetic layer 120. The spin filter structure 111 may be disposed to have a portion that is in contact with the free magnetic layer 120 or may be disposed not to have a portion that is in contact with the free magnetic layer 120. The spin filter structure 111 may be formed by a conventional patterning process to have a corner or may be a sidewall spacer structure formed by a conformal deposition process or an anisotropic etching process.

Figure 13:
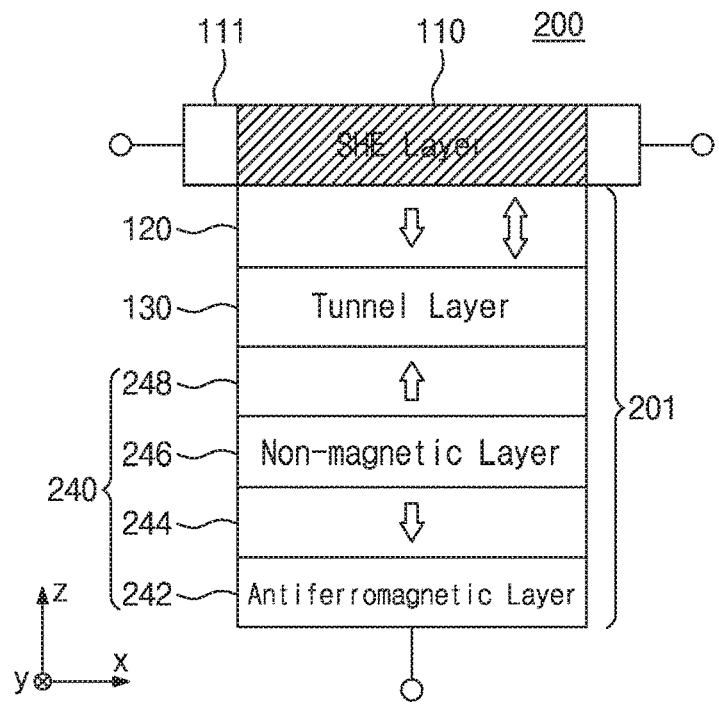
FIGS. 13 through 20 are conceptual diagrams of magnetic tunnel junction devices according to other example embodiments of the present disclosure, respectively.

FIG. 13 is a conceptual diagram of a magnetic tunnel junction device according to another example embodiment of the present disclosure.

Referring to FIG. 13, a magnetic tunnel junction device 200 includes a magnetic tunnel junction 201 including a pinned magnetic layer 240, a free magnetic layer 120, and a tunnel barrier layer 130 interposed between the pinned magnetic layer 240 and the free magnetic layer 120, a conductive pattern 110 which is disposed adjacent to the free magnetic layer 120 to cause spin Hall effect or Rashba effect to apply a spin torque to the free magnetic layer 120 of the magnetic tunnel junction 101, and a spin filter structure 111 disposed on at least one of the opposite side surfaces of the conductive pattern 110 in a direction in which the in-plane current is applied. The spin filter structure 111 filters the injected current to control the amount and direction of a spin and supplies the filtered current to the conductive pattern 110.

The spin filter structure 111 is disposed on at least one of the opposite side surfaces of the conductive pattern 110 in a direction in which the in-plane current flows. The spin filter structure 111 filters injected current to control the amount and direction of a spin and supplies the injected current to the conductive pattern 110.

The magnetic layer 240 may be a synthetic antiferromagnetic structure including a first pinned magnetic layer 244, a non-magnetic layer 246 for a pinned magnetic layer, and a second pinned magnetic layer 248 which are sequentially stacked. Each of the first and second pinned magnetic layers 244 and 248 may independently include at least one of Fe, Co, Ni, Gd, B, Si, Zr, and a combination thereof. The non-magnetic layer 246 for a pinned magnetic layer may include at least one of Ru, Ta, Cu, Pt, Pd, W, Cr, and a combination thereof.

According to a modified embodiment of the present disclosure, the pinned magnetic layer 240 may be an exchange-biased antiferromagnetic structure including an antiferromagnetic layer 242, a first pinned magnetic layer 244, a non-magnetic layer 246 for a pinned magnetic layer, and a second pinned magnetic layer 248 which are sequentially stacked. The antiferromagnetic layer 242 may be formed of a material including at least one of Ir, Pt, Fe, Mn, and a combination thereof. Each of the first pinned magnetic layer 244 and the second pinned magnetic layer 248 may be independently formed of a material including at least one of Fe, Co, Ni, Gd, B, Si, Zr, and a combination thereof. The non-magnetic layer 246 for a pinned magnetic layer may be formed of a material including at least one of Ru, Ta, Cu, Pt, Pd, W, Cr, and a combination thereof.

Figure 14:
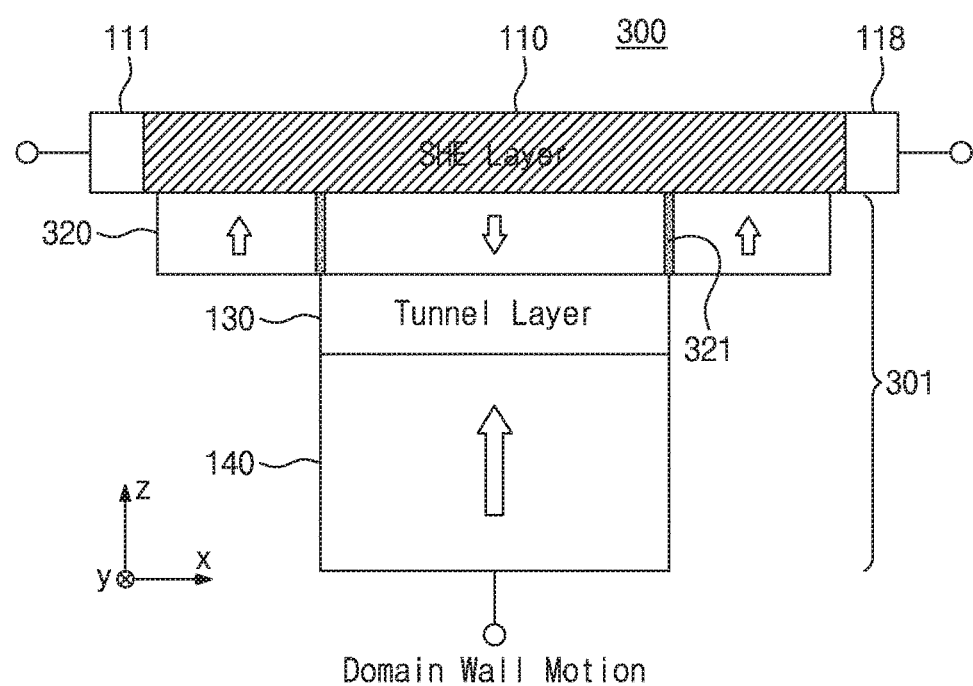

FIG. 14 is a conceptual diagram of a magnetic tunnel junction device according to another example embodiment of the present disclosure.

Referring to FIG. 14, a magnetic tunnel junction device 300 includes a magnetic tunnel junction 301 including a pinned magnetic layer 140, a free magnetic layer 320, and a tunnel barrier layer 130 interposed between the pinned magnetic layer 140 and the free magnetic layer 120, a conductive pattern 110 which is disposed adjacent to the free magnetic layer 120 to cause spin Hall effect or Rashba effect to apply a spin torque to the free magnetic layer 120 of the magnetic tunnel junction 101, and a spin filter structure 111 disposed on at least one of the opposite side surfaces of the conductive pattern 110 in a direction in which the in-plane current is applied. The spin filter structure 111 filters the injected current to control the amount and direction of a spin and supplies the filtered current to the conductive pattern 110.

The pinned magnetic layer 140 and the free magnetic layer 320 may not be aligned with each other. Specifically, the free magnetic layers 320 may extend parallel to each other in an extending direction of the conductive pattern 110. The free magnetic layer 320 may include at least one magnetic domain 321. The magnetic domain 321 may be a magnetic wall or a skyrmion and may divide magnetic domains magnetized in opposite directions.

Figure 15:
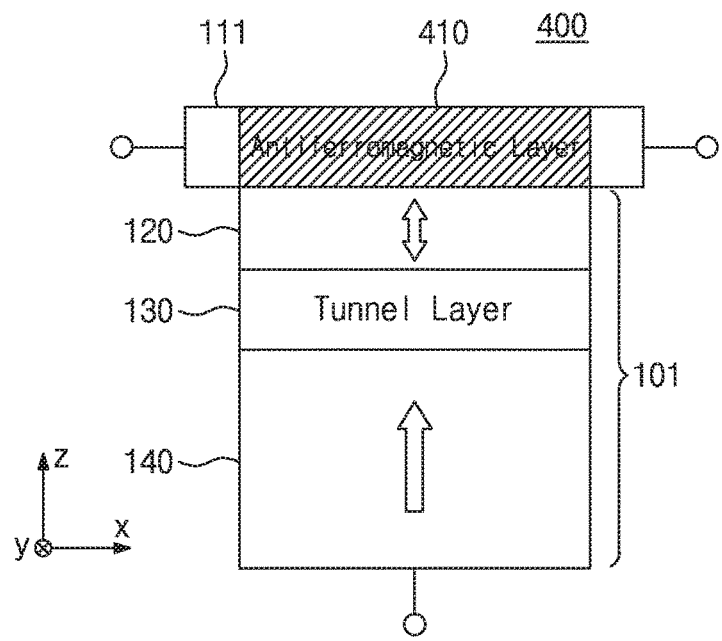

FIG. 15 is a conceptual diagram of a magnetic tunnel junction device according to another example embodiment of the present disclosure.

Referring to FIG. 15, a magnetic tunnel junction device 400 includes a magnetic tunnel junction 101 including a pinned magnetic layer 140, a free magnetic layer 120, and a tunnel barrier layer 130 interposed between the pinned magnetic layer 140 and the free magnetic layer 120, a conductive pattern 410 which is disposed adjacent to the free magnetic layer 120 to cause spin Hall effect or Rashba effect to apply a spin torque to the free magnetic layer 120 of the magnetic tunnel junction 101, and a spin filter structure 111 disposed on at least one of the opposite side surfaces of the conductive pattern 410 in a direction in which the in-plane current is applied. The spin filter structure 111 filters the injected current to control the amount and direction of a spin and supplies the filtered current to the conductive pattern 410.

The conductive pattern 410 may include a conductive antiferromagnet. Specifically, the conductive pattern 410 may apply the in-plane current and may include an antiferromagnetic layer. The conductive pattern 410 may provide an in-plane exchange-biased magnetic field to the free magnetic layer 120 having perpendicular magnetic anisotropy. Specifically, the conductive pattern 410 may be PtMn, IrMn or FeMn. The antiferromagnetic layer may provide an exchange-biased magnetic field to the free magnetic layer 120. Thus, the magnetic tunnel junction device 400 may switch a magnetization direction of the free magnetic layer 120 having perpendicular magnetic anisotropy without using an external magnetic field.

Figure 16:
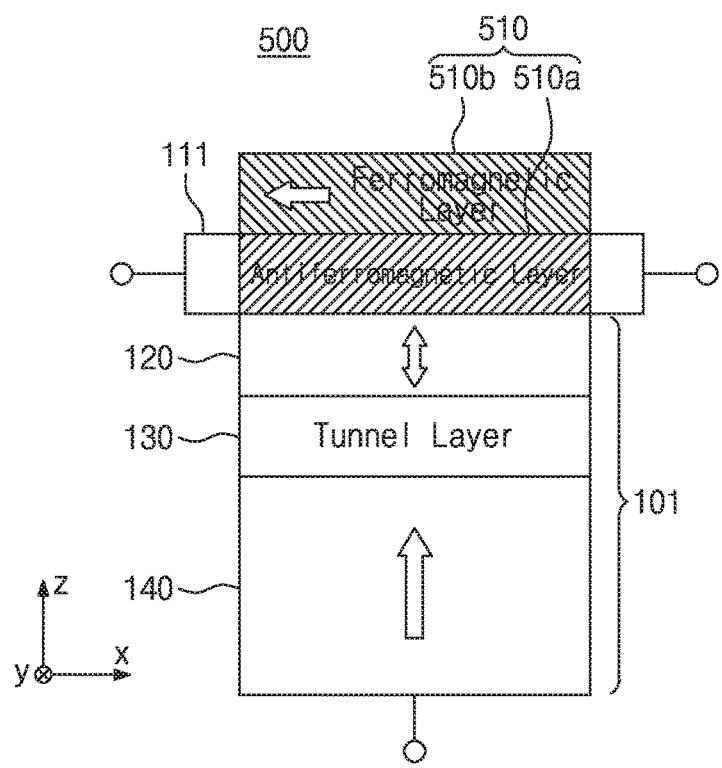

FIG. 16 is a conceptual diagram of a magnetic tunnel junction device according to another example embodiment of the present disclosure.

Referring to FIG. 16, a magnetic tunnel junction device 500 includes a magnetic tunnel junction 101 including a pinned magnetic layer 140, a free magnetic layer 120, and a tunnel barrier layer 130 interposed between the pinned magnetic layer 140 and the free magnetic layer 120, a conductive pattern 510 which is disposed adjacent to the free magnetic layer 120 to cause spin Hall effect or Rashba effect to apply a spin torque to the free magnetic layer 120 of the magnetic tunnel junction 101, and a spin filter structure 111 disposed on at least one of the opposite side surfaces of the conductive pattern 510 in a direction in which the in-plane current is applied. The spin filter structure 111 filters the injected current to control the amount and direction of a spin and supplies the filtered current to the conductive pattern 510.

The conductive pattern 510 applying the in-plane current may include an antiferromagnetic layer 510a and a ferromagnetic layer 510b which are sequentially stacked. The ferromagnetic layer 510b may have an in-plane magnetization direction or a magnetization direction in which the ferromagnetic layer 510b extends. The antiferromagnetic layer 510a may provide an in-plane exchange-biased magnetic field to the free magnetic field 120. The free magnetic field 120 may be switched without using an external magnetic field.

The ferromagnetic layer 510b has in-plane magnetic anisotropy and provides a function to antiferromagnetically align the antiferromagnetic layer 510a in an in-plane direction. The antiferromagnetic layer 510a adjacent to the free magnetic layer 120 having perpendicular magnetic anisotropy establishes an exchange-biased magnetic field in a direction horizontal to the free magnetic layer 120 having perpendicular magnetic anisotropy. Specifically, the antiferromagnetic layer 510a is antiferromagnetically aligned in the in-plane direction by an exchange interaction between the ferromagnetic layer 510b having in-plane anisotropy and the antiferromagnetic layer 510a during thermal annealing under a horizontal magnetic field. Thus, an exchange-biased magnetic field of a horizontal direction is induced at the free magnetic field 120 having perpendicular magnetic anisotropy adjacent to another side by an antiferromagnetic rule. Current flowing to the conductive pattern 510 including the antiferromagnetic layer 510a generates a spin-orbit torque through anomalous Hall effect or spin Hall effect. The spin filter structure 111 may be disposed only on a side surface of the antiferromagnetic layer 510a.

Figure 17:
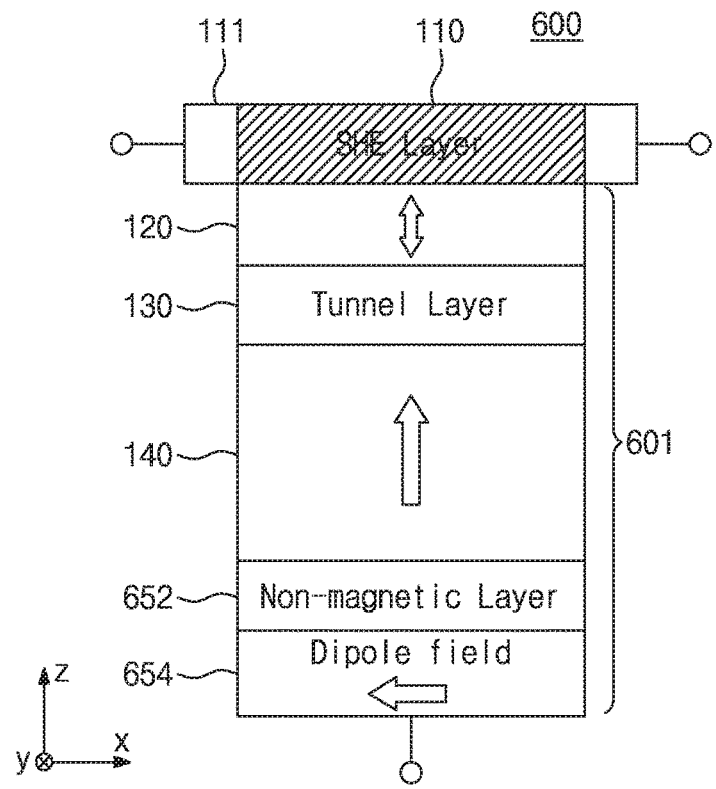

FIG. 17 is a conceptual diagram of a magnetic tunnel junction device according to another example embodiment of the present disclosure.

Referring to FIG. 17, a magnetic tunnel junction device 600 includes a magnetic tunnel junction 101 including a pinned magnetic layer 140, a free magnetic layer 120, and a tunnel barrier layer 130 interposed between the pinned magnetic layer 140 and the free magnetic layer 120, a conductive pattern 110 which is disposed adjacent to the free magnetic layer 120 to cause spin Hall effect or Rashba effect to apply a spin torque to the free magnetic layer 120 of the magnetic tunnel junction 101, and a spin filter structure 111 disposed on at least one of the opposite side surfaces of the conductive pattern 110 in a direction in which the in-plane current is applied. The spin filter structure 111 filters the injected current to control the amount and direction of a spin and supplies the filtered current to the conductive pattern 110.

A dipole field non-magnetic layer 652 and a dipole field ferromagnetic layer 654 having an in-plane magnetization direction are sequentially stacked adjacent to the pinned magnetic layer 140. The dipole field non-magnetic layer 652 is disposed adjacent to the pinned magnetic layer 140.

The dipole field non-magnetic layer 652 may include at least one of Ru, Ta, Cu, Pt, Pd, W, Cr, and a combination thereof.

The dipole field ferromagnetic layer 654 may have an in-plane magnetization direction (e.g., −x axis direction) and may establish a dipole magnetic field to establish a magnetic field in the free magnetic field 120 in an in-plane direction (+x axis direction). Thus, the magnetic tunnel junction device 600 may perform magnetization reversal without using an external magnetic field.

Figure 18:
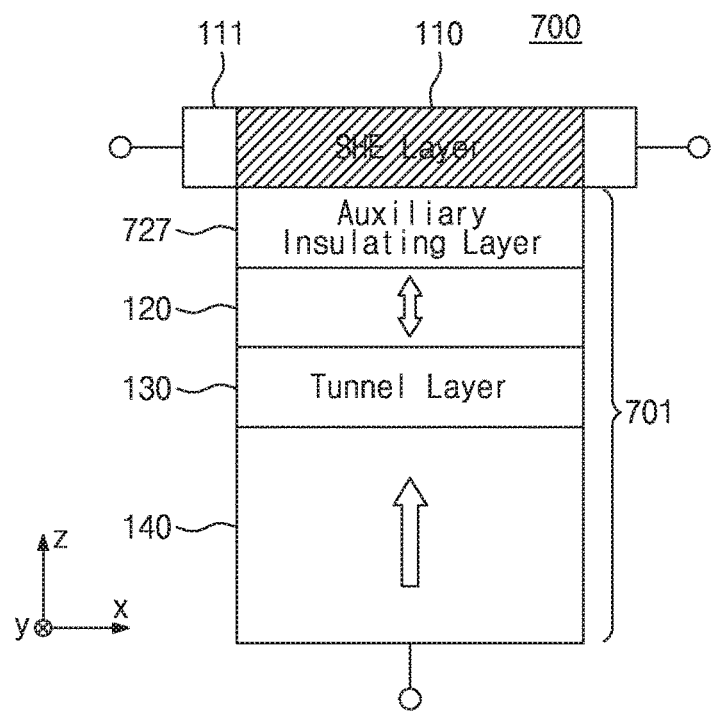

FIG. 18 is a conceptual diagram of a magnetic tunnel junction device according to another example embodiment of the present disclosure.

Referring to FIG. 18, a magnetic tunnel junction device 700 includes a magnetic tunnel junction 701 including a pinned magnetic layer 140, a free magnetic layer 120, and a tunnel barrier layer 130 interposed between the pinned magnetic layer 140 and the free magnetic layer 120, a conductive pattern 110 which is disposed adjacent to the free magnetic layer 120 to cause spin Hall effect or Rashba effect to apply a spin torque to the free magnetic layer 120 of the magnetic tunnel junction 101, and a spin filter structure 111 disposed on at least one of the opposite side surfaces of the conductive pattern 110 in a direction in which the in-plane current is applied. The spin filter structure 111 filters the injected current to control the amount and direction of a spin and supplies the filtered current to the conductive pattern 110.

An auxiliary insulating layer 727 may be disposed between the conductive pattern 110 and the free magnetic layer 120. The auxiliary insulating layer 727 may include at least one of $AlO_x$, MgO, $TaO_x$, $ZrO_x$, and a combination thereof. The auxiliary insulating layer 727 may prevent in-plane charge current flowing along the conductive pattern 110 from flowing directly through the magnetic tunnel junction 701 and may allow only pure spin current to pass through the magnetic tunnel junction 701.

Figure 19:
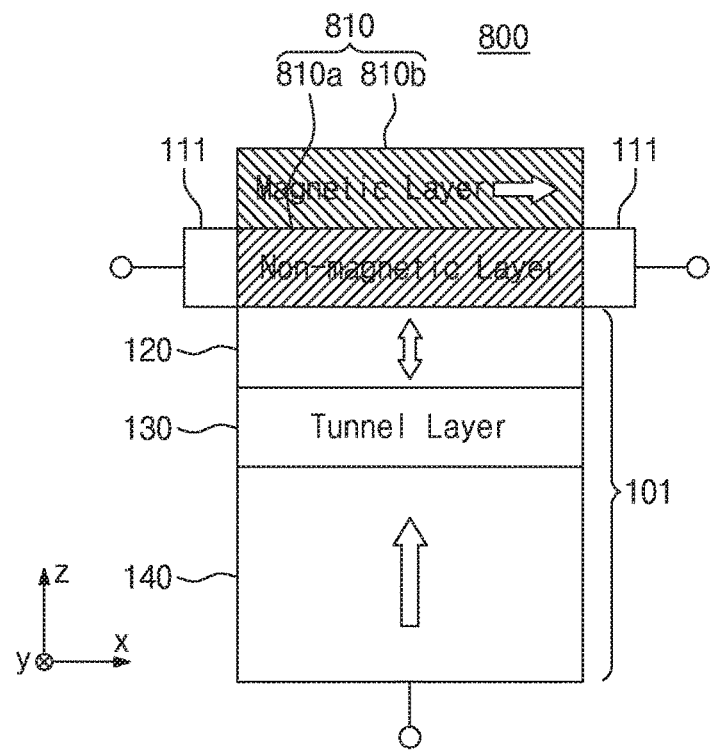

FIG. 19 is a conceptual diagram of a magnetic tunnel junction device according to another example embodiment of the present disclosure.

Referring to FIG. 19, a magnetic tunnel junction device 800 includes a magnetic tunnel junction 101 including a pinned magnetic layer 140, a free magnetic layer 120, and a tunnel barrier layer 130 interposed between the pinned magnetic layer 140 and the free magnetic layer 120, a conductive pattern 810 which is disposed adjacent to the free magnetic layer 120 to cause spin Hall effect or Rashba effect to apply a spin torque to the free magnetic layer 120 of the magnetic tunnel junction 101, and a spin filter structure 111 disposed on at least one of the opposite side surfaces of the conductive pattern 810 in a direction in which the in-plane current is applied. The spin filter structure 111 filters the injected current to control the amount and direction of a spin and supplies the filtered current to the conductive pattern 810.

The conductive pattern 810 may include a conductive non-magnetic layer 810a and a conducting wire ferromagnetic layer 810b which are sequentially stacked. The conducting wire ferromagnetic layer 810b may include an in-plane magnetization direction component. The conducting wire non-magnetic layer 810a may be disposed adjacent to the free magnetic layer 120. The conducting wire non-magnetic layer 810a may be one selected from the group consisting of Cu, Ta, Pt, W, Bi, Ir, Mn, Ti, Cr, Pd, Re, Os, Hf, Mo, Ru, and a combination thereof. The conducting wire ferromagnetic layer 810b may include at least one of Fe, Co, Ni, B, Si, Zr, and a combination thereof. Spin current may be generated through internal anomalous Hall effect or anisotropic magnetoresistance effect of the conducting wire ferromagnetic layer 810b by in-plane charge current flowing through the conducting wire ferromagnetic layer 810b [T. Taniguchi, J. Grollier, M. D. Stiles, Physical Review Applied 3, 044001 (2015)]. Alternatively, spin current may be generated by interface spin-orbit coupling effect of the conducting wire ferromagnetic layer 810b and the conducting wire non-magnetic layer 810a [V. P. Amin, M. D. Stiles, Physical Review B 94, 104419 (2016)]. The spin filter structure 111 may be disposed on at least one of the opposite sides of the conducting wire non-magnetic layer 810a.

Figure 20:
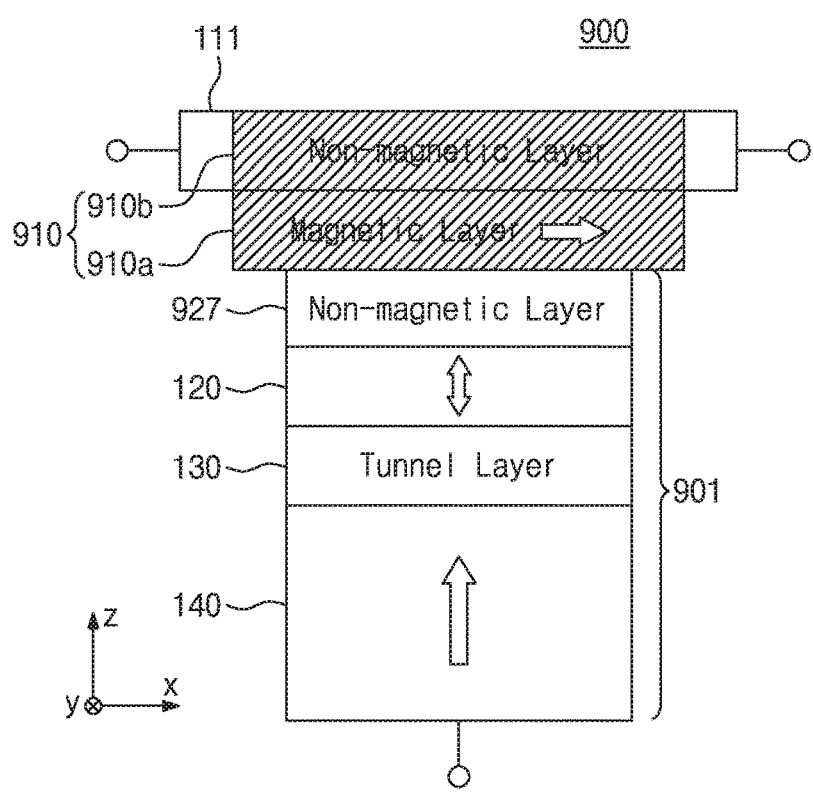

FIG. 20 is a conceptual diagram of a magnetic tunnel junction device according to another example embodiment of the present disclosure.

Referring to FIG. 20, a magnetic tunnel junction device 900 includes a magnetic tunnel junction 901 including a pinned magnetic layer 140, a free magnetic layer 120, and a tunnel barrier layer 130 interposed between the pinned magnetic layer 140 and the free magnetic layer 120, a conductive pattern 910 which is disposed adjacent to the free magnetic layer 120 to cause spin Hall effect or Rashba effect to apply a spin torque to the free magnetic layer 120 of the magnetic tunnel junction 101, and a spin filter structure 111 disposed on at least one of the opposite side surfaces of the conductive pattern 910 in a direction in which the in-plane current is applied. The spin filter structure 111 filters the injected current to control the amount and direction of a spin and supplies the filtered current to the conductive pattern 910.

The conductive pattern 910 may include a conducting wire ferromagnetic layer 910a and a conducting wire non-magnetic layer 910b which are sequentially stacked. A non-magnetic layer 927 may be provided between the conducting wire ferromagnetic layer 910a and the free magnetic layer 120. The conducting wire ferromagnetic layer 910a may be disposed adjacent to the free magnetic layer 120. The non-magnetic layer 927 may be aligned with a side surface of the free magnetic layer 120.

The conducting wire non-magnetic layer 910b and the non-magnetic layer 927 may be one selected from the group consisting of Cu, Ta, Pt, W, Bi, Ir, Mn, Ti, Cr, Pd, Re, Os, Hf, Mo, Ru, and a combination thereof. The conducting wire ferromagnetic layer 910a may include at least one of Fe, Co, Ni, Gd, B, Si, Zr, and a combination thereof. The spin filter structure 111 may be disposed on at least one of the opposite side surfaces of the conducting wire non-magnetic layer 910b.

Figure 21:
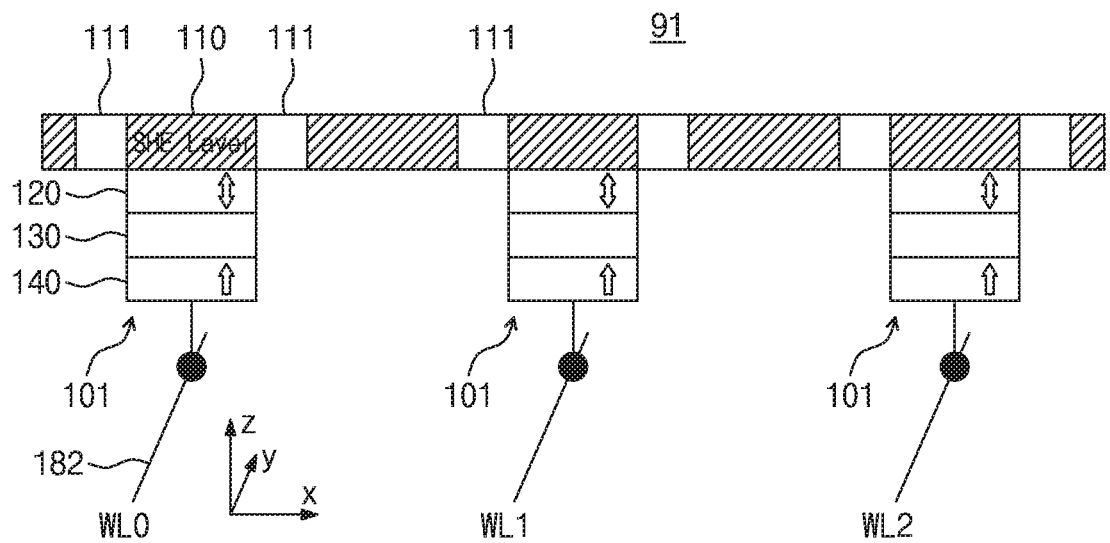
FIGS. 21 through 28 illustrate magnetic memory devices according to other example embodiments of the present disclosure, respectively.

FIG. 21 illustrates a magnetic memory device according to another example embodiment of the present disclosure.

Referring to FIG. 21, a magnetic memory device 91 includes a plurality of magnetic tunnel junctions 101. The magnetic tunnel junction 101 or the magnetic tunnel junction device 100 may be variously modified, as described with reference to FIGS. 2 to 14.

The magnetic memory device 91 includes a plurality of magnetic tunnel junctions 101 arranged in a matrix format, a first conductive pattern 110 disposed adjacent to a free magnetic layer 120 of the magnetic tunnel junction 101, and a spin filter structure 111 disposed on at least one of the opposite side surfaces of the first conductive pattern 110. The first conductive pattern 110 provides a spin-orbit torque (SOT) caused by a spin-orbit coupling force between the free magnetic layer 120 and the first conductive pattern 110, and the spin filter structure 111 provides spin-polarized current to the first conductive pattern 110.

The first conductive pattern 110 may be formed of one selected from the group consisting of Cu, Ta, Pt, W, Bi, Ir, Mn, Ti, Cr, Pd, Re, Os, Hf, Mo, Ru, and a combination thereof. The first conductive pattern 110 may supply spin current to the free magnetic layer 120 and may apply a spin-orbit torque to the free magnetic layer 120. The spin-orbit torque may contribute to magnetization reversal of the free magnetic layer 120.

The first conductive layers 110 may extend parallel to each other on a substrate plane in a first direction. A free magnetic layer of each of the magnetic tunnel junctions 101 arranged in the first direction may be periodically disposed adjacent to the first conductive pattern 110. A second conductive pattern 182 or WL may be electrically connected to a pinned magnetic layer 140 of each of the magnetic tunnel junctions 101 arranged in a second direction perpendicular to the first direction and may extend on the substrate plane in the second direction.

The magnetic memory device 91 may operate as a cross-point memory. The magnetic memory device 91 may operate due to spin-polarized current flowing to the first conductive pattern 110, spin Hall effect caused by the spin-polarized current, and critical current reduction effect caused by a voltage applied to the second conductive pattern 182. Alternatively, the magnetic memory device 91 may operate due to spin-polarized current generated by current flowing to the first conductive pattern 110, spin Hall effect caused by the spin-polarized current, and spin-transfer torque effect flowing through a selected magnetic tunnel junction.

Figure 22:
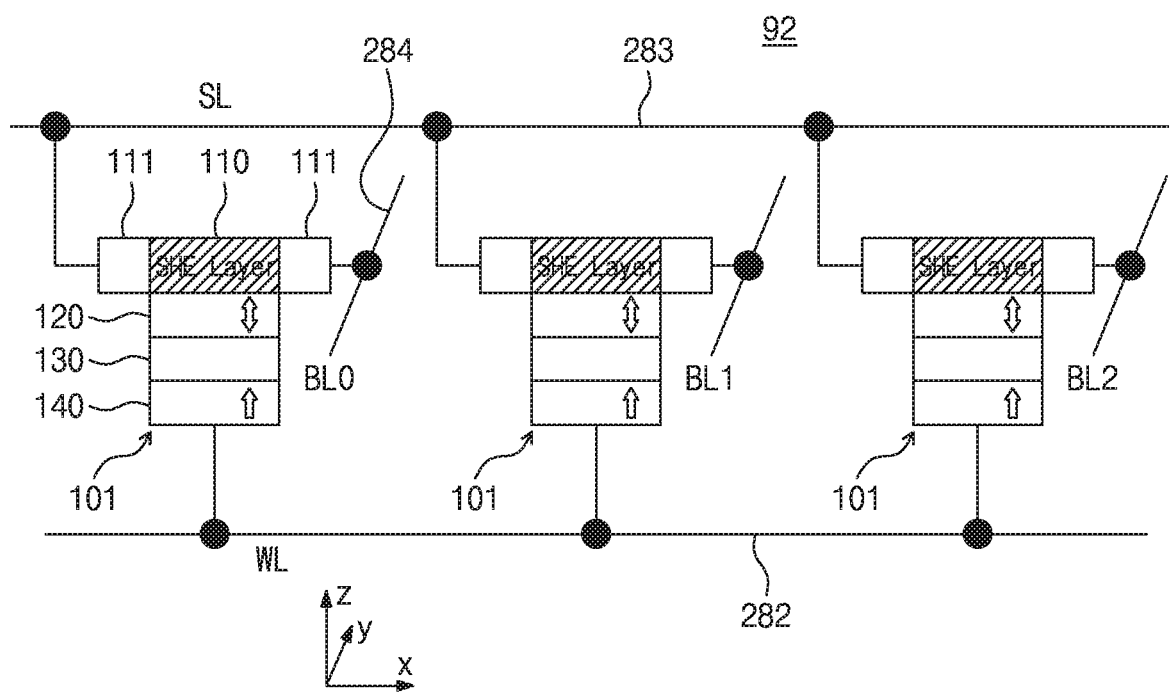

FIG. 22 illustrates a magnetic memory device according to another example embodiment of the present disclosure.

Referring to FIG. 22, a magnetic memory device 92 includes a plurality of magnetic tunnel junctions. The magnetic memory device 92 includes a plurality of magnetic tunnel junctions 101 arranged in a matrix format, a first conductive pattern 110 disposed adjacent to a free magnetic layer 120 of the magnetic tunnel junction 101, and a spin filter structure 111 disposed on at least one of the opposite side surfaces of the first conductive pattern 110. The first conductive pattern 110 provides a spin-orbit torque (SOT) caused by a spin-orbit coupling force between the free magnetic layer 120 and the first conductive pattern 110, and the spin filter structure 111 supplies spin-polarized current to the first conductive pattern 110.

The first conductive pattern 110 may be periodically disposed to be spaced apart from each other on a substrate plane in a first direction. A free magnetic layer 120 of each of the magnetic tunnel junctions arranged in the first direction may be periodically disposed adjacent to the first conductive pattern 110. The first conductive pattern 110 may supply spin current to the free magnetic layer 120 and may apply a spin-orbit torque to the free magnetic layer 120. The spin-orbit torque may contribute to magnetization reversal of the free magnetic layer 120. The spin filter structure 111 may supply spin-polarized current to the first conductive pattern 110.

A second conductive pattern 282 or WL is electrically connected to the pinned magnetic layer 140 of each of the magnetic tunnel junctions arranged in the first direction and extends on the substrate plane in the first direction.

A third conductive layer 283 or SL is connected to one end of each of the first conductive patterns 110 arranged in the first direction and extends in the first direction.

A fourth conductive pattern 284 or BL is connected to other end of each of the first conductive patterns 110 arranged in the second direction and extends in the second direction.

The magnetic memory device 92 may operate as a modified cross-point memory. The first conductive patterns 110 may be divided into each other to inject spin current into the free magnetic layer 120. When current flows through the third conductive pattern 283, the first conductive pattern 110, and the fourth conductive pattern 284, in-plane current flowing to the first conductive pattern 110 may contribute to magnetization reversal of the free magnetic layer 120 by injecting spin current into the free magnetic layer 120.

Figure 23:
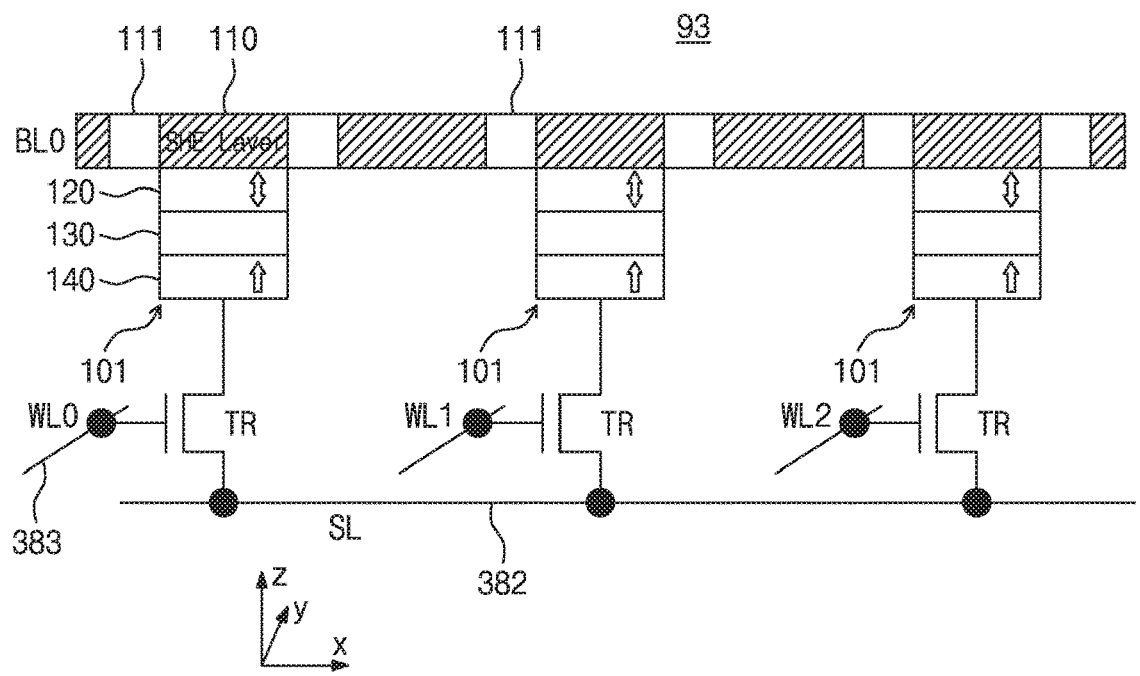

FIG. 23 illustrates a magnetic memory device according to another example embodiment of the present disclosure.

Referring to FIG. 23, a magnetic memory device 93 includes a plurality of magnetic tunnel junctions. The magnetic memory device 93 includes a plurality of magnetic tunnel junctions 101 arranged in a matrix format, a first conductive pattern 110 disposed adjacent to a free magnetic layer 120 of the magnetic tunnel junction 101, and a spin filter structure 111 disposed on at least one of the opposite side surfaces of the first conductive pattern 110. The first conductive pattern 110 provides a spin-orbit torque (SOT) caused by a spin-orbit coupling force between the free magnetic layer 120 and the first conductive pattern 110, and the spin filter structure 111 supplies spin-polarized current to the first conductive pattern 110.

The first conductive pattern 110 may extend on a substrate plane in a first direction, and a free magnetic layer 120 of each of the magnetic tunnel junctions arranged in the first direction may be periodically disposed adjacent to the first conductive pattern 110 or BL. The first conductive pattern 110 may supply spin current to the free magnetic layer 120 and may apply spin-orbit torque to the free magnetic layer 120. The spin-orbit torque may contribute to magnetization reversal of the free magnetic layer 120. The spin filter structure 111 may be periodically disposed at the first conductive pattern 110.

Selection transistors TR may be electrically connected to pinned magnetic layers 140 of the magnetic tunnel junctions 101, respectively.

A second conductive pattern 382 or SL may be electrically connected to source/drain of each of the selection transistors arranged in the first direction and may extend on the substrate plane in the first direction.

A third conductive pattern 383 or WL may be connected to a gate of each of the selection transistors TR arranged in a second direction perpendicular to the first direction.

When current flows to a specific first conductive pattern 110 (BL0), free magnetic layers of all magnetic tunnel junctions connected to the first conductive pattern 110 may receive spin current. On the other hand, a voltage is applied to a specific third conductive pattern connected to a gate of the selection transistor TR to select a specific memory cell. Thus, the specific memory cell may be provided with a voltage or spin-transfer current to a pinned magnetic layer by spin current generated by the first conductive pattern or a selected selection transistor TR. As a result, a specific memory cell may perform a write operation.

Figure 24:
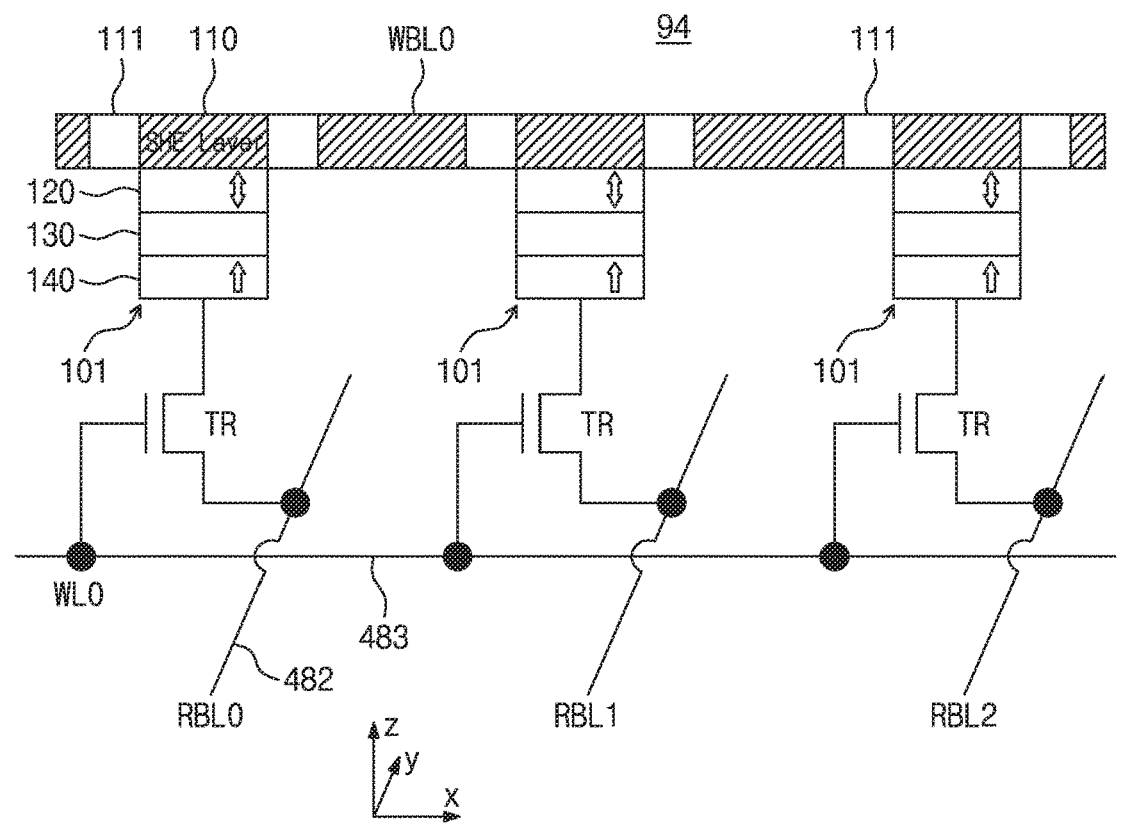

FIG. 24 illustrates a magnetic memory device according to another example embodiment of the present disclosure.

Referring to FIG. 24, a magnetic memory device 94 includes a plurality of magnetic tunnel junctions. The magnetic memory device 94 includes a plurality of magnetic tunnel junctions 101 arranged in a matrix format, a first conductive pattern 110 disposed adjacent to a free magnetic layer 120 of the magnetic tunnel junction 101, and a spin filter structure 111 disposed on at least one of the opposite side surfaces of the first conductive pattern 110. The first conductive pattern 110 provides a spin-orbit torque (SOT) caused by a spin-orbit coupling force between the free magnetic layer 120 and the first conductive pattern 110, and the spin filter structure 111 supplies spin-polarized current to the first conductive pattern 110.

The first conductive pattern 110 or WBL may extend on a substrate plane in a first direction, and a magnetic free layer 120 of each of the magnetic tunnel junctions arranged in the first direction may be periodically disposed adjacent to the first conductive pattern 110. The first conductive pattern 110 may supply spin current to the free magnetic layer 120 and may apply a spin-orbit torque to the free magnetic layer 120. The spin-orbit torque may contribute to magnetization reversal of the free magnetic layer 120. The spin filter structure may be periodically disposed on opposite sides of the first conductive pattern 110.

Selection transistors TR may be electrically connected to pinned magnetic layers 140 of the magnetic tunnel junctions, respectively.

The second conductive patterns 482 or RBL may be electrically connected to source/drain of each of the selection transistors TR arranged in a second direction perpendicular to the first direction and may extend on the substrate plane in the second direction.

A third conductive pattern 483 or WL may be connected to a gate of each of the selection transistors TR arranged in the first direction.

To perform a write operation on a specific memory cell, a specific first conductive pattern is selected and current flows to the selected first conductive pattern. In addition, a third conductive patterns connected to a gate of a selection transistor TR connected to the selected memory cell is selected and thus a voltage is applied to the pinned magnetic layer or spin-transfer current flows to the pinned magnetic layer. As a result, the specific memory cell may perform a write operation.

Figure 25:
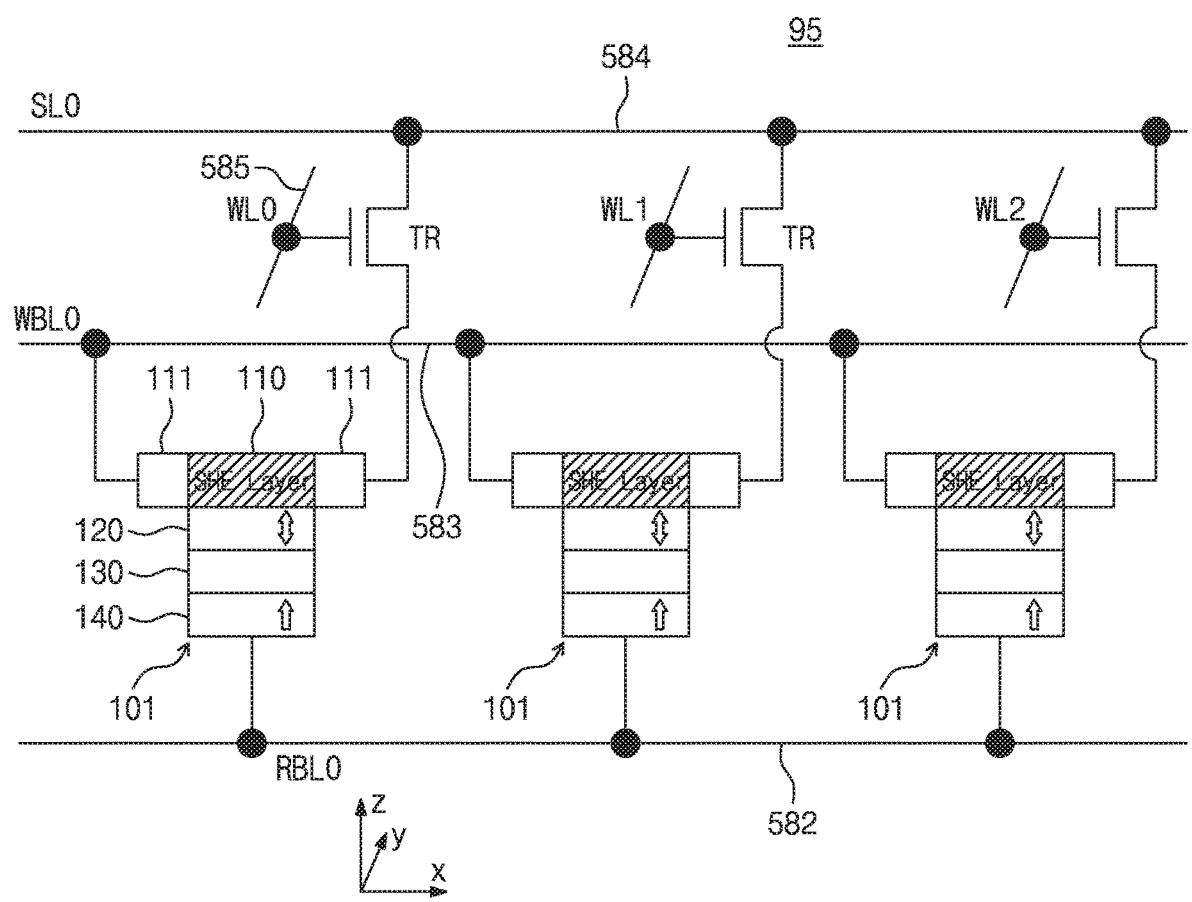

FIG. 25 illustrates a magnetic memory device according to another example embodiment of the present disclosure.

Referring to FIG. 25, a magnetic memory device 95 includes a plurality of magnetic tunnel junctions. The magnetic memory device 95 includes a plurality of magnetic tunnel junctions 101 arranged in a matrix format, a first conductive pattern 110 disposed adjacent to a free magnetic layer 120 of the magnetic tunnel junction 101, and a spin filter structure 111 disposed on at least one of the opposite side surfaces of the first conductive pattern 110. The first conductive pattern 110 provides a spin-orbit torque (SOT) caused by a spin-orbit coupling force between the free magnetic layer 120 and the first conductive pattern 110, and the spin filter structure 111 supplies spin-polarized current to the first conductive pattern 110.

The first conductive pattern 110 may be periodically disposed on a substrate plane in a first direction, and a magnetic free layer 120 of each of the magnetic tunnel junctions arranged in the first direction may be periodically disposed adjacent to the first conductive pattern 110. The first conductive pattern 110 may supply spin current to the free magnetic layer 120 and may apply a spin-orbit torque to the free magnetic layer 120. The spin-orbit torque may contribute to magnetization reversal of the free magnetic layer 120. The spin filter structure 111 may be disposed on at least one side of the first conductive pattern 110.

The second conductive patterns 582 or RBL may be electrically connected to a pinned magnetic layer 140 of each of the magnetic tunnel junctions arranged in the first direction and may extend in the first direction.

A third conductive pattern 583 or WBL may be connected to one end of each of the first conductive patterns 110 arranged in the first direction and may extend in the first direction.

Selection transistors TR may be connected to the other end of the first conductive pattern 110.

A fourth conductive pattern 584 or SL may be connected to source/drain of the selection transistors TR arranged in the first direction and may extend in the first direction.

A fifth conductive pattern 585 or WL may be connected to a gate of the selection transistors TR arranged in a second direction perpendicular to the first direction and may extend in the second direction.

Figure 26:
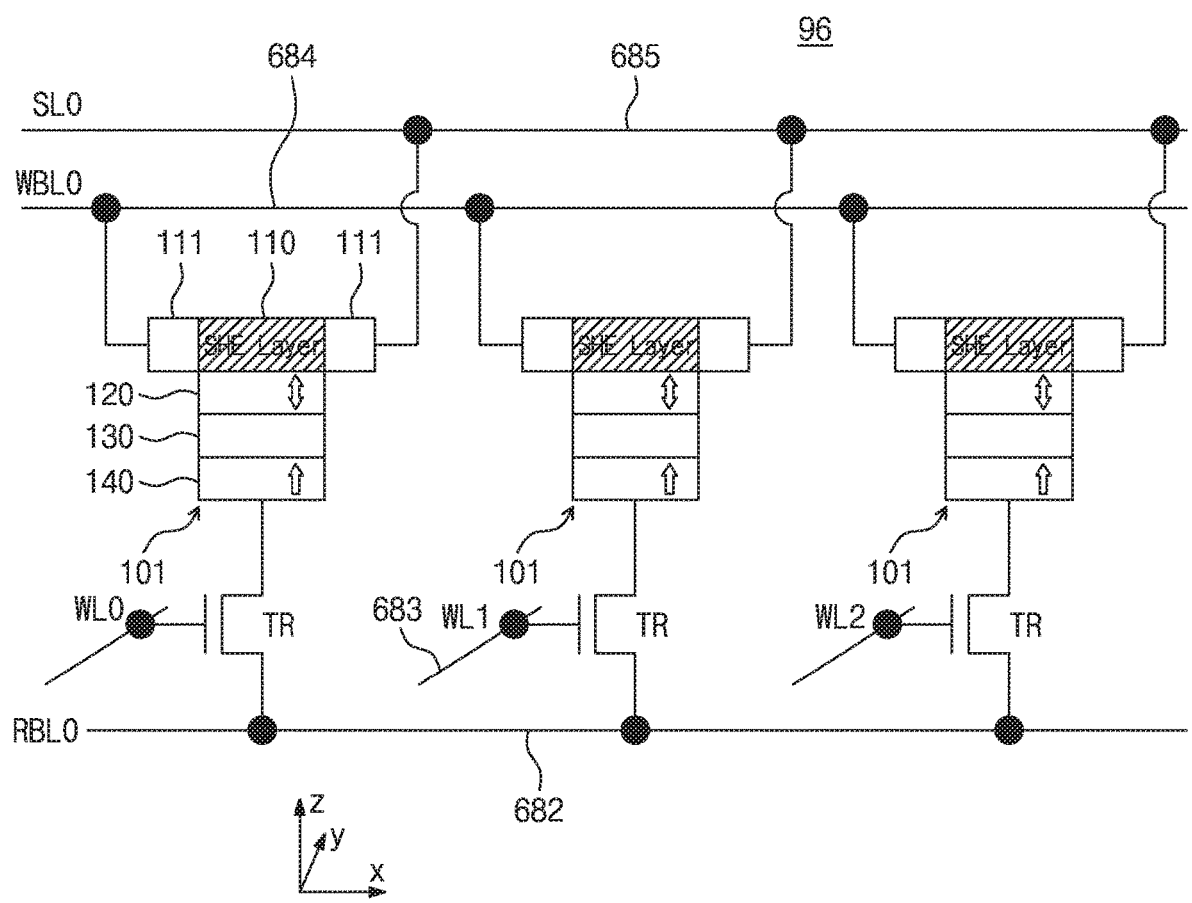

FIG. 26 illustrates a magnetic memory device according to another example embodiment of the present disclosure.

Referring to FIG. 26, a magnetic memory device 96 includes a plurality of magnetic tunnel junctions. The magnetic memory device 96 includes a plurality of magnetic tunnel junctions 101 arranged in a matrix format, a first conductive pattern 110 disposed adjacent to a free magnetic layer 120 of the magnetic tunnel junction 101, and a spin filter structure 111 disposed on at least one of the opposite side surfaces of the first conductive pattern 110. The first conductive pattern 110 provides a spin-orbit torque (SOT) caused by a spin-orbit coupling force between the free magnetic layer 120 and the first conductive pattern 110, and the spin filter structure 111 supplies spin-polarized current to the first conductive pattern 110.

The first conductive pattern 110 may be periodically disposed on a substrate plane in a first direction, and a magnetic free layer 120 of each of the magnetic tunnel junctions arranged in the first direction may be periodically disposed adjacent to the first conductive pattern 110. The first conductive pattern 110 may supply spin current to the free magnetic layer 120 and may apply a spin-orbit torque to the free magnetic layer 120. The spin-orbit torque may contribute to magnetization reversal of the free magnetic layer 120. The spin filter structure 111 may be disposed on at least one side of the first conductive pattern 110.

Selection transistors TR may be connected to pinned ferromagnetic layers 140 of the magnetic tunnel junctions, respectively.

A second conductive pattern 682 or RBL may be connected to source/drain of each of the selection transistors arranged in the first direction and may extend in the first direction.

A third conductive 683 or WL may be connected to a gate of each of the selection transistors TR arranged in a second direction perpendicular to the first direction and may extend in the second direction.

A fourth conductive pattern 684 or WBL may be connected to one end of each of the first conductive patterns 110 arranged in the first direction and may extend in the first direction.

A fifth conductive pattern 685 or SL may be connected to the other end of each of the first conductive patterns 110 arranged in the first direction and may extend in the first direction.

Figure 27:
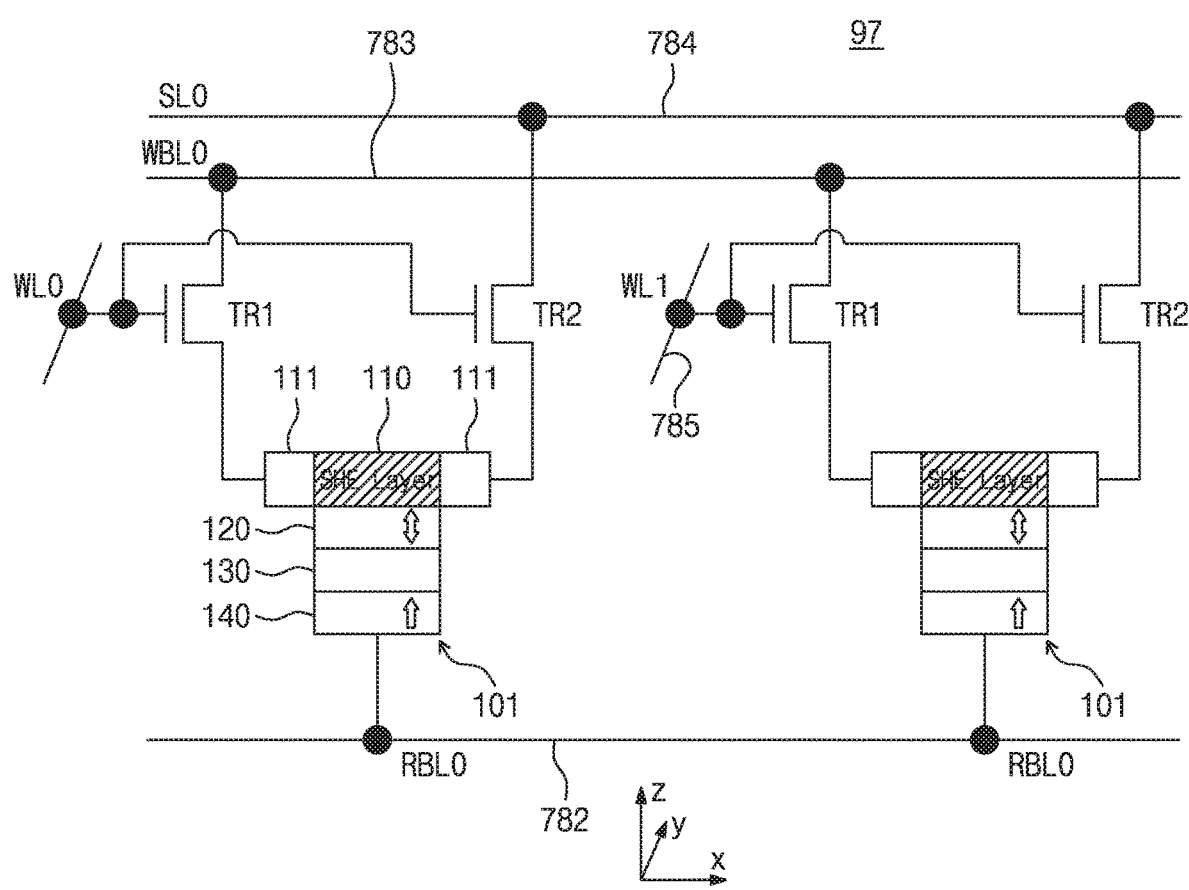

FIG. 27 illustrates a magnetic memory device according to another example embodiment of the present disclosure.

Referring to FIG. 27, a magnetic memory device 97 includes a plurality of magnetic tunnel junctions. The magnetic memory device 97 includes a plurality of magnetic tunnel junctions 101 arranged in a matrix format, a first conductive pattern 110 disposed adjacent to a free magnetic layer 120 of the magnetic tunnel junction 101, and a spin filter structure 111 disposed on at least one of the opposite side surfaces of the first conductive pattern 110. The first conductive pattern 110 provides a spin-orbit torque (SOT) caused by a spin-orbit coupling force between the free magnetic layer 120 and the first conductive pattern 110, and the spin filter structure 111 supplies spin-polarized current to the first conductive pattern 110.

The first conductive pattern 110 may be periodically disposed on a substrate plane in a first direction, and a magnetic free layer 120 of each of the magnetic tunnel junctions arranged in the first direction may be periodically disposed adjacent to the first conductive pattern 110. The first conductive pattern 110 may supply spin current to the free magnetic layer 120 and may apply a spin-orbit torque to the free magnetic layer 120. The spin-orbit torque may contribute to magnetization reversal of the free magnetic layer 120.

A second conductive pattern 782 may be electrically connected to a pinned magnetic layer 140 of each of the magnetic tunnel junctions arranged in the first direction and may extend in a second direction perpendicular to the first direction.

A first selection transistor TR1 may be connected to one end of the first conductive pattern 110.

A second selection transistor TR2 may be connected to the other end of the first conductive pattern 110.

A third conductive pattern 783 or WBL may be connected to source/drain of the first selection transistors TR1 disposed in the first direction and may extend in the first direction.

A fourth conductive pattern 784 or SL may be connected to source/drain of the second selection transistor TR2 disposed in the first direction and may extend in the first direction.

A fifth conductive pattern 785 may connect a gate of the first selection transistor TR1 disposed in a second direction perpendicular to the first direction and a gate of the second selection transistor TR2 disposed in the first direction to each other to extend in the second direction.

Figure 28:
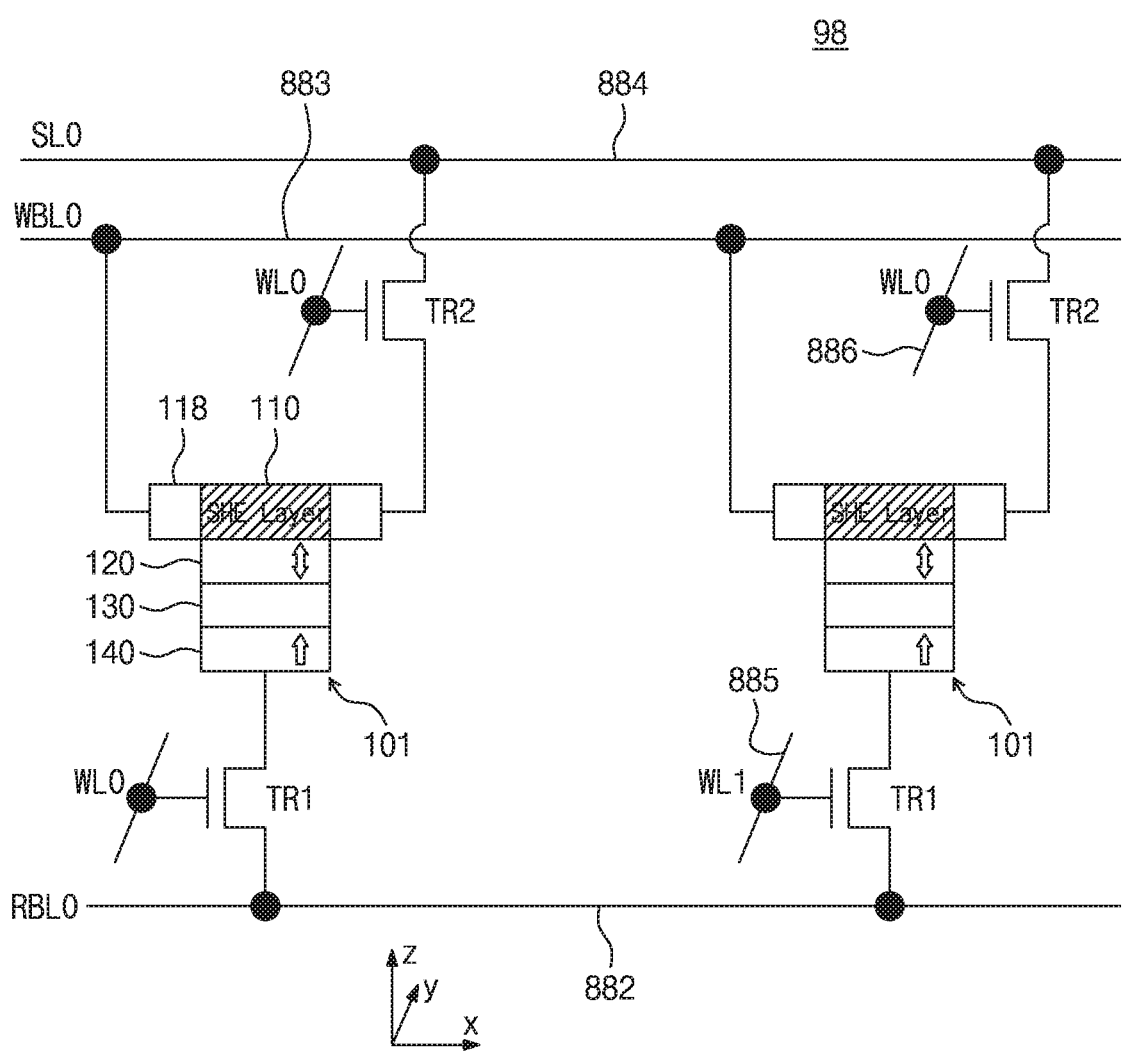

FIG. 28 illustrates a magnetic memory device according to another example embodiment of the present disclosure.

Referring to FIG. 28, a magnetic memory device 98 includes a plurality of magnetic tunnel junctions. The magnetic memory device 98 includes a plurality of magnetic tunnel junctions 101 arranged in a matrix format, a first conductive pattern 110 disposed adjacent to a free magnetic layer 120 of the magnetic tunnel junction 101, and a spin filter structure 111 disposed on at least one of the opposite side surfaces of the first conductive pattern 110. The first conductive pattern 110 provides a spin-orbit torque (SOT) caused by a spin-orbit coupling force between the free magnetic layer 120 and the first conductive pattern 110, and the spin filter structure 111 supplies spin-polarized current to the first conductive pattern 110.

The first conductive pattern 110 may be periodically disposed on a substrate plane in a first direction, and a magnetic free layer 120 of each of the magnetic tunnel junctions arranged in the first direction may be periodically disposed adjacent to the first conductive pattern 110. The first conductive pattern 110 may supply spin current to the free magnetic layer 120 and may apply a spin-orbit torque to the free magnetic layer 120. The spin-orbit torque may contribute to magnetization reversal of the free magnetic layer 120.

A first selection transistor TR1 may be connected to a pinned magnetic layer 140 of the magnetic tunnel junction.

A second selection transistor TR2 may be connected to one end of the first conductive pattern 110.

A second conductive pattern 882 or RBL may be connected to source/drain of the first selection transistor TR1 disposed in the first direction and may extend in the first direction.

A third conductive pattern 883 or WBL may be connected to the other end of the first conductive pattern 110 disposed in the first direction and may extend in the first direction.

A fourth conductive pattern 884 or SL may be connected to source/drain of the second selection transistor TR2 disposed in the first direction and may extend in the first direction.

A fifth conductive pattern 885 or WL may connect gates of the first selection transistors TR1 arranged in a second direction perpendicular to the first direction and may extend in the second direction.

A sixth conductive pattern 886 or WL may connect gates of the second selection transistors TR2 arranged in the second direction and may extend in the second direction.

Referring to FIGS. 21 through 28, the free magnetic layer 120 may include at least one a magnetic domain structure. The magnetic domain structure may be a magnetic wall or a skyrmion.

Referring to FIGS. 21 through 28, the first conductive pattern 110 may apply in-plane current and may include an antiferromagnetic layer. The first conductive pattern 110 may provide an in-plane exchange bias magnetic field to the free magnetic layer 120.

Referring to FIGS. 21 through 28, the first conductive pattern 110 may apply in-plane current and may include an antiferromagnetic layer and a ferromagnetic layer which are sequentially stacked. The antiferromagnetic layer may be disposed adjacent to the free magnetic layer, and the ferromagnetic layer may have an in-plane magnetization direction. The first conductive pattern may provide an in-plane exchange bias magnetic field to the free magnetic layer, and the free magnetic layer may be switched without an external magnetic field.

Referring to FIGS. 21 through 28, a magnetic tunnel junction may further include an auxiliary insulating layer disposed between the first conductive pattern 110 and the free magnetic layer 120.

Referring to FIGS. 21 through 28, the first conductive pattern 110 may include a first conductive pattern non-magnetic layer and a first conductive pattern magnetic layer which are sequentially stacked, and the first conductive pattern magnetic layer may include an in-plane magnetization direction component.

Referring to FIGS. 21 through 28, the first conductive pattern 110 may include a first conductive pattern magnetic layer and a first conductive pattern non-magnetic layer which are sequentially stacked and may include a non-magnetic layer disposed between the first conductive pattern magnetic layer and the free magnetic layer.

As described above, a magnetic tunnel junction device according to an example embodiment of the present disclosure includes a spin filter (SF) structure which includes a magnetic field whose spin polarization (SP) is greater than 0 and equal to or smaller than 1. By abutting the spin filter structure onto a portion beside a conducting wire in a conventional SOT junction structure, the amount and direction of a spin generated according to injected current may controlled to increase spin accumulation or improve spin-orbit torque efficiency. Thus, the injected current may be reduced to reduce power consumption. Moreover, when a magnetization direction of the spin filter (SF) and a magnetization direction of a free magnetic layer are parallel or antiparallel to each other, an external magnetic field does not need to be applied, i.e., field-free switching may be performed.

Although the present disclosure and its advantages have been described in detail, it should be understood that various changes, substitutions and alterations can be made herein without departing from the spirit and scope of the disclosure as defined by the following claims.

What is claimed is:

1. A magnetic tunnel junction memory device comprising:
   a magnetic tunnel junction comprising:
      a pinned magnetic layer,
      a free magnetic layer, and
      a tunnel barrier layer interposed between the pinned magnetic layer and the free magnetic layer;
   a conductive pattern to which in-plane direct current is configured to flow, the conductive pattern being disposed in contact with the free magnetic layer of the magnetic tunnel junction to cause spin Hall effect or Rashba effect to apply a spin torque to the free magnetic layer of the magnetic tunnel junction to switch a magnetization direction of the free magnetic layer by the spin torque due to spin Hall effect or Rashba effect; and
   a pair of spin filter structures disposed on both side surfaces of the conductive pattern in a direction in which in-plane direct current is applied, wherein the spin filter structures have a fixed magnetization direction,
   wherein the spin filter structures are configured to filter injected current to control amount and direction of a spin and to supply filtered current to the conductive pattern,
   wherein the magnetization direction of the free magnetic layer is parallel or anti-parallel to a magnetization direction of the pinned magnetic layer,
   wherein the fixed magnetization direction of each of the spin filter structures is parallel or anti-parallel to the magnetization direction of the free magnetic layer,
   wherein the fixed magnetization direction of the spin filter structures is antiparallel at both sides of the conductive layer, and
   wherein the conductive pattern is only formed of non-magnetic metal.

2. The magnetic tunnel junction memory device according to claim 1, wherein spin polarization of the spin filter structure is greater than 0 and equal to or smaller than 1.

3. The magnetic tunnel junction memory device according to claim 1, wherein the spin filter structure is a half-metallic ferromagnet.

4. The magnetic tunnel junction memory device according to claim 3, wherein the half-metallic ferromagnet includes at least one of a Heusler alloy, magnetite ($Fe_3O_4$), and lanthanum strontium manganite (LSMO).

5. The magnetic tunnel junction device according to claim 1, wherein
   the spin filter structures include a ferromagnet.

6. The magnetic tunnel junction memory device according to claim 1, wherein the conductive pattern and the free magnetic layer are aligned vertically with each other.

7. The magnetic tunnel junction memory device according to claim 1, wherein the free magnetic layer has perpendicular magnetic anisotropy (PMA) and the pinned magnetic layer has PMA.

8. The magnetic tunnel junction memory device according to claim 1, wherein a spin-flip diffusion length of the conductive pattern is between 3 and 4 nanometers.

9. The magnetic tunnel junction memory device according to claim 1, wherein:
   the pinned magnetic layer has a synthetic antiferromagnetic structure including a first pinned magnetic layer, a non-magnetic layer for a pinned magnetic layer, and a second pinned magnetic layer which are sequentially stacked,
   each of the first pinned magnetic layer and the second pinned magnetic layer independently includes at least one of Fe, Co, Ni, Gd, B, Si, Zr, and a combination thereof, and
   the non-magnetic layer for a pinned magnetic layer includes at least one of Ru, Ta, Cu, Pt, Pd, W, Cr, and a combination thereof.

10. The magnetic tunnel junction memory device according to claim 1, wherein:
    the pinned magnetic layer has an exchange-biased antiferromagnetic structure including an antiferromagnetic layer, a first pinned magnetic layer, a non-magnetic layer, for a pinned magnetic layer, and a second pinned magnetic layer which are sequentially stacked,
    the antiferromagnetic layer is formed of one selected from the group consisting of Pt, Ir, Fe, Mn, and a combination thereof,
    each of the first pinned magnetic layer and the second pinned magnetic layer independently includes at least one of Fe, Co, Ni, Gd, B, Si, Zr, and a combination thereof, and
    the non-magnetic layer for a pinned magnetic layer includes at least one of Ru, Ta, Cu, Pt, Pd, W, Cr, and a combination thereof.

11. The magnetic tunnel junction memory device according to claim 1, wherein the tunnel barrier layer is formed of one selected from the group consisting of $AlO_x$, MgO, $TaO_x$, $ZrO_x$, and a combination thereof.

12. The magnetic tunnel junction memory device according to claim 1, wherein:
    the conductive pattern provides a spin-orbit torque (SOT) resulting from a spin-orbit coupling force between the free magnetic layer and the conductive pattern, and
    the conductive pattern is formed of one selected from the group consisting of Cu, Ta, Pt, W, Bi, Ir, Ti, Pd, Re, Os, Hf, Mo, Ru, and a combination thereof.

13. The magnetic tunnel junction memory device according to claim 1, wherein the free magnetic layer includes at least one magnetic domain structure.

14. The magnetic tunnel junction memory device according to claim 1, comprising:
    a dipole field non-magnetic layer and a dipole field magnetic layer having an in-plane magnetization direction which are sequentially stacked adjacent to the pinned magnetic layer,
    wherein the dipole field non-magnetic layer is disposed adjacent to the pinned magnetic layer, and
    wherein the free magnetic layer is configured to be switched without an external magnetic field.

* * * * *